(12) United States Patent
Akimoto et al.

(10) Patent No.: US 8,318,551 B2
(45) Date of Patent: Nov. 27, 2012

(54) SEMICONDUCTOR DEVICE AND MANUFACTURING METHOD THEREOF

(75) Inventors: Kengo Akimoto, Atsugi (JP); Toshinari Sasaki, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 353 days.

(21) Appl. No.: 12/627,204

(22) Filed: Nov. 30, 2009

(65) Prior Publication Data
US 2010/0133531 A1 Jun. 3, 2010

(30) Foreign Application Priority Data

Dec. 1, 2008 (JP) .................................. 2008-306219

(51) Int. Cl.
*H01L 21/84* (2006.01)
*H01L 29/10* (2006.01)
*H01L 29/12* (2006.01)

(52) U.S. Cl. .......... 438/158; 438/161; 438/162; 257/43; 257/E21.414; 257/E29.273; 257/E29.296; 257/E21.432; 349/42; 349/43

(58) Field of Classification Search .................. 257/43, 257/E21.414, E29.273, E29.296, E21.619, 257/E21.432; 438/158, 161, 162; 349/42, 349/43
See application file for complete search history.

(56) References Cited

U.S. PATENT DOCUMENTS

| | | | |
|---|---|---|---|
| 4,381,213 A | 4/1983 | Flowers et al. | |
| 5,561,075 A | 10/1996 | Nakazawa | |
| 5,648,662 A | 7/1997 | Zhang et al. | |
| 5,731,856 A | 3/1998 | Kim et al. | |
| 5,744,864 A | 4/1998 | Cillessen et al. | |
| 5,847,410 A | 12/1998 | Nakajima | |
| 6,146,927 A | 11/2000 | Yamanaka | |
| 6,294,274 B1 | 9/2001 | Kawazoe et al. | |
| 6,403,408 B1 | 6/2002 | Green et al. | |
| 6,563,174 B2 | 5/2003 | Kawasaki et al. | |

(Continued)

FOREIGN PATENT DOCUMENTS

EP 1737044 A 12/2006

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Julio J Maldonado
*Assistant Examiner* — Maria Ligai
(74) *Attorney, Agent, or Firm* — Eric J. Robinson; Robinson Intellectual Property Law Office, P.C.

(57) ABSTRACT

A gate electrode layer over a substrate; a gate insulating layer over the gate electrode layer; a first source electrode layer and a first drain electrode layer over the gate insulating layer; an oxide semiconductor layer over the gate insulating layer; and a second source electrode layer and a second drain electrode layer over the oxide semiconductor layer. A first part, a second part, and a third part of a bottom surface are in contact with the first source electrode layer, the first drain electrode layer, and the gate insulating layer respectively. A first part and a second part of the top surface are in contact with the second source electrode layer and the second drain electrode layer respectively. The first source electrode layer and the first drain electrode layer are electrically connected to the second source electrode layer and the second drain electrode layer respectively.

10 Claims, 17 Drawing Sheets

U.S. PATENT DOCUMENTS

| | | |
|---|---|---|
| 6,586,346 B1 | 7/2003 | Yamazaki et al. |
| 6,727,522 B1 | 4/2004 | Kawasaki et al. |
| 6,933,213 B2 | 8/2005 | Lee |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,749,825 B2 | 7/2010 | Honda |
| 7,910,490 B2 | 3/2011 | Akimoto et al. |
| 7,932,521 B2 | 4/2011 | Akimoto et al. |
| 2001/0046027 A1 | 11/2001 | Tai et al. |
| 2001/0052466 A1 | 12/2001 | Horii |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218166 A1 | 11/2003 | Tsutsui |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0183970 A1 | 9/2004 | Niiya |
| 2005/0014319 A1 | 1/2005 | Yamazaki et al. |
| 2005/0017302 A1 | 1/2005 | Hoffman |
| 2005/0139823 A1 | 6/2005 | Hirakata et al. |
| 2005/0173701 A1 | 8/2005 | Kawase et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0087487 A1 | 4/2007 | Honda |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0067508 A1 | 3/2008 | Endo et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0025678 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0264420 A1 | 10/2010 | Honda |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |

FOREIGN PATENT DOCUMENTS

| | | |
|---|---|---|
| EP | 1770788 | 4/2007 |
| EP | 1995787 | 11/2008 |
| EP | 1998373 | 12/2008 |
| EP | 1998374 | 12/2008 |
| EP | 1998375 | 12/2008 |
| EP | 2226847 A | 9/2010 |
| JP | 60-198861 A | 10/1985 |
| JP | 61-051188 | 3/1986 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 05-070156 B | 10/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-223048 | 8/2005 |
| JP | 2007-096055 | 4/2007 |

| | | |
|---|---|---|
| JP | 2007-123861 | 5/2007 |
| JP | 2007-250983 A | 9/2007 |
| JP | 2008-130761 | 6/2008 |
| WO | WO-02/01603 | 1/2002 |
| WO | WO-2004/114391 | 12/2004 |
| WO | WO-2007-043493 | 4/2007 |
| WO | WO-2007/119386 | 10/2007 |

OTHER PUBLICATIONS

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Park.J et al., "High performance amorphous oxide thin film transistors with self-aligned top-gate structure,", IEDM 09: Technical Digest of International Electron Devices Meeting, Dec. 7, 2009, pp. 191-194.

Nakamura. M, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800- 803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

International Search Report (Application No. PCT/JP2009/070082) dated Feb. 16, 2010.

Written Opinion (Application No. PCT/JP2009/070082) dated Feb. 16, 2010.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors using Amorphous Oxside Semiconductions,", Nature, Nov. 25, 2004, vol. 432, pp. 488-492.

Takahashi.M et al., "Theoretical Analysis of IGZO Transparent Amorphous Oxide Semiconductor,", IDW '08 : Proceedings of the 15th International Display Workshops, Dec. 3, 2008, 1637-1640.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$-$Ga_2ZnO_4$-ZnO system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)_m$ (m = 3, 4, and 5), $InGaO_3(ZnO)_3$, and $Ga_2O_3(ZnO)_m$ (m = 7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Osada.T et al., "15.2: Development of Driver-Integrated Panel using Amorphous In-Ga-Oxide TFT,", SID Digest '09 : SID International Symposium Digest of Technical Papers, May 31, 2009, pp. 184-187.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, pp. 899-902.

Kanno.H et al., "White Stacked Electrophosphorecent Organic Light-Emitting Device Employing $MoO_3$ as a Change-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display WorkShops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties, SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09: Proceesings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-277.

Park.S et al., "Challenge to Future Displays: Transparent AM-OLED Driven by PEALD Grown ZnO TFT,", IMID '07 Digest, 2007, p. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, 33-36.

Hirao.T et al., "Novel Top-Gate Zinc Oxide Thin-Film Transistors (ZnO TFTS) for AMLCDS,", Journal of the SID , 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 IN. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "58.2 Invited Paper : Suftla Flexible Microelectronics on Their Way to Business,", SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Kikuchi.H et al., "Polymer-Stabilized Liquid Crystal Blue Phases,", Nature Materials, Sep. 2, 2002, vol. 1, pp. 64-68.

Kimizuka.N. et al., "SPINEL,$YbFe_2O_4$, and $Yb_2Fe_3O_7$ Types of Structures for Compounds in the $In_2O_3$ and $Sc_2O_3$-$A_2O_3$-BO Systems [A: Fe, Ga, or Al; B: Mg, Mn, Fe, Ni, Cu, or Zn] At Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

The American Heritage Dictionary of the English Language, Fourth Edition. Houghton Mifflin company, 2004. http://dictionary.reference.com/browse/contact (accessed: Jan. 2, 2008).

SEMICONDUCTOR DEVICE AND MANUFACTURING METHOD THEREOF

TECHNICAL FIELD

The present invention relates to a semiconductor device using an oxide semiconductor and a manufacturing method thereof.

BACKGROUND ART

In recent years, a technique in which a thin film transistor (also called TFT) is manufactured using an oxide semiconductor and applied to an electronic device or the like has attracted attention. For example, in Patent Documents 1 and 2, techniques in which a switching element of an apparatus for displaying an image, or the like is manufactured using zinc oxide, an In—Ga—Zn—O-based oxide semiconductor, or the like as an oxide semiconductor layer have been disclosed.
(Patent Document)
Patent Document 1: Japanese Published Patent Application No. 2007-123861
Patent Document 2: Japanese Published Patent Application No. 2007-096055

DISCLOSURE OF INVENTION

In the case where an oxide semiconductor layer is used for manufacturing a TFT as described above, a TFT with higher electrical characteristics than the case of using an amorphous silicon layer can be obtained. Therefore, in the case where a TFT using an oxide semiconductor layer is used instead of a TFT using an amorphous silicon layer, further miniaturization of a TFT can be expected.

However, as for the miniaturization of the TFT, various problems might occur. The problem of contact resistance between an oxide semiconductor layer and a source electrode layer (or a drain electrode layer) is one example thereof. This problem results from a large decrease of the contact area between the oxide semiconductor layer and the source electrode layer in accordance with the miniaturization of the TFT, and increase of the resistance of the contact area.

Such increase of the contact resistance worsens the TFT characteristics: not only simple reduction of the electron field-effect mobility but also change of the switching characteristics is caused.

The above-described change of the switching characteristics can be understood through the consideration of high conductivity (that is low resistivity) of an oxide semiconductor layer used for a channel formation region. This is because the resistance of the TFT can be assumed as a sum of the contact resistance and the resistance of the channel formation region, and as the resistance of the channel formation region decreases, the ratio of the contribution of the contact resistance increases so that current is controlled by rather the contact resistance than the resistance of the channel formation region.

In view of the foregoing problems, it is an object of the present invention to reduce the contact resistance between an oxide semiconductor layer and an electrode layer in a semiconductor device using an oxide semiconductor (also called an oxide semiconductor device). It is another object to provide an oxide semiconductor device with high characteristics at low cost.

In accordance with the present invention, two source electrode layers (or drain electrode layers) are provided above and below an oxide semiconductor layer which functions as an active layer (e.g., a channel formation region) of a transistor to interpose the oxide semiconductor layer therebetween. In other words, an oxide semiconductor layer is formed above a first source electrode layer (or a first drain electrode layer) and a second source electrode layer (or a second drain electrode layer) is formed above the oxide semiconductor layer. The first source electrode layer (or the first drain electrode layer) and the second source electrode layer (or the second drain electrode layer) are electrically connected to each other.

Details thereof will be described below.

One embodiment of the present invention is a semiconductor device which includes a gate electrode layer over a substrate, a gate insulating layer over the gate electrode layer, a first source electrode layer and a first drain electrode layer over the gate insulating layer, an oxide semiconductor layer over the gate insulating layer, and a second source electrode layer and a second drain electrode layer over the oxide semiconductor layer. A first part of a bottom surface of the oxide semiconductor layer is in contact with the first source electrode layer, a second part of the bottom surface is in contact with the first drain electrode layer, and a third part of the bottom surface is in contact with the gate insulating layer. A first part of a top surface of the oxide semiconductor layer is in contact with the second source electrode layer, and a second part of the top surface is in contact with the second drain electrode layer. The first source electrode layer is electrically connected to the second source electrode layer, and the first drain electrode layer is electrically connected to the second drain electrode layer.

Another embodiment of the present invention is a semiconductor device which includes a gate electrode layer, a first source electrode layer, and a first drain electrode layer each formed using the same material layer over a substrate, a gate insulating layer over the gate electrode layer, an oxide semiconductor layer over the gate insulating layer, the first source electrode layer, and the first drain electrode layer, a second source electrode layer and a second drain electrode layer over the oxide semiconductor layer, the first source electrode layer, and the first drain electrode layer A first part of a bottom surface of the oxide semiconductor layer is in contact with the first source electrode layer, a second part of the bottom surface is in contact with the first drain electrode layer, and a third part of the bottom surface is in contact with the gate insulating layer A first part of a top surface of the oxide semiconductor layer is in contact with the second source electrode layer, and a second part of the top surface is in contact with the second drain electrode layer. The first source electrode layer is electrically connected to the second source electrode layer, and the first drain electrode layer is electrically connected to the second drain electrode layer.

In the above-described embodiment, it is preferable that the oxide semiconductor layer contains at least a material selected from materials consisting of indium, gallium, and zinc. Further, it is preferable that the third part of the bottom surface of the oxide semiconductor layer has higher hydrogen concentration than a channel formation region of the oxide semiconductor layer. Further, it is preferable that the first part of the top surface of the oxide semiconductor layer and the second part of the top surface of the oxide semiconductor layer have higher hydrogen concentration than a channel formation region of the oxide semiconductor layer. Specifically, for example, it is preferable that the respective hydrogen concentrations of the regions be greater than or equal to $1 \times 10^{19}$ atoms/cm$^3$. Further, it is preferable that the third part of the bottom surface of the oxide semiconductor layer is overlapped with the gate electrode.

Another embodiment of the present invention is a method for manufacturing a semiconductor device, which includes the following: a gate electrode layer is formed over a substrate; a gate insulating layer is formed over the gate electrode layer; a first source electrode layer and a first drain electrode layer are formed over the gate insulating layer; an oxide semiconductor layer over the gate insulating layer, the first source electrode layer, and the first drain electrode layer is formed so that a first part of a bottom surface of the oxide semiconductor layer is in contact with the first source electrode layer, a second part of the bottom surface is in contact with the first drain electrode layer, and a third part of the bottom surface is in contact with the gate insulating layer; a second source electrode layer and a second drain electrode layer are formed over the oxide semiconductor layer, the first source electrode layer, and the first drain electrode layer so that a first part of a top surface of the oxide semiconductor layer is in contact with the second source electrode layer, and a second part of the top surface is in contact with the second drain electrode layer. The first source electrode layer is electrically connected to the second source electrode layer, and the first drain electrode layer is electrically connected to the second drain electrode layer.

Another embodiment of the present invention is a method for manufacturing a semiconductor device, which includes the following: a conductive film is formed over a substrate; a gate electrode layer, a first source electrode layer, and a first drain electrode layer are formed using the conductive film; a gate insulating layer is formed over the gate electrode layer; an oxide semiconductor layer is formed over the gate insulating layer, the first source electrode layer and the first drain electrode layer so that a first part of a bottom surface of the oxide semiconductor layer is in contact with the first source electrode layer, a second part of the bottom surface is in contact with the first drain electrode layer, and a third part of the bottom surface is in contact with the gate insulating layer; a second source electrode layer and a second drain electrode layer are formed over the oxide semiconductor layer, the first source electrode layer, and the first drain electrode layer so that a first part of a top surface of the oxide semiconductor layer is in contact with the second source electrode layer, and a second part of the top surface is in contact with the second drain electrode layer. The first source electrode layer is electrically connected to the second source electrode layer, and the first drain electrode layer is electrically connected to the second drain electrode layer.

In the above-described embodiment, it is preferable that the oxide semiconductor layer contains at least a material selected from materials consisting of indium, gallium, and zinc. Further, it is preferable that the first source electrode layer and the first drain electrode layer contain hydrogen. Further, it is preferable that the second source electrode layer and the second drain electrode layer contain hydrogen. Specifically, for example, it is preferable that respective hydrogen concentrations of the above-described regions be greater than or equal to $1 \times 10^{19}$ atoms/cm$^3$. Further, in such a case, it is preferable that thermal treatment is performed after forming the second source electrode layer and the second drain electrode layer to change a hydrogen concentration of the oxide semiconductor layer, thereby decreasing the resistance of the regions of the oxide semiconductor layer, which are in contact with the first source electrode layer and the first drain electrode layer and the resistance of the regions of the oxide semiconductor layer, which are in contact with the second source electrode layer and the second drain electrode layer.

As one example of an oxide semiconductor which can be used in this specification, an oxide semiconductor described as $InMO_3(ZnO)_m$ (m>0) is given. Note here that M denotes a single metal element or a plurality of metal elements selected from gallium (Ga), iron (Fe), nickel (Ni), manganese (Mn), and cobalt (Co). For example, the cases where Ga is selected as M include the case where only Ga is selected and the cases where Ga and the above metal element other than Ga, such as Ga and Ni, and Ga and Fe, are selected. Moreover, in the oxide semiconductor, in some cases, a transition metal element such as Fe or Ni or an oxide of the transition metal is contained as an impurity element in addition to the metal element contained as M. In this specification, among the above-described oxide semiconductors, any oxide semiconductor in which at least gallium is contained as M is referred to as an In—Ga—Zn—O-based oxide semiconductor and a thin film using this material may be referred to as an In—Ga—Zn—O-based non-single-crystal film.

In this specification, a semiconductor device means any device which can function by utilizing semiconductor characteristics; a display device, a semiconductor circuit, an electronic device are all included in the category of the semiconductor device.

According to the present invention, two source electrode layers (or drain electrode layers) are provided above and below an oxide semiconductor layer which functions as an active layer to interpose the oxide semiconductor layer therebetween, thereby largely decreasing the contact resistance between the oxide semiconductor layer and the source electrode layer (or the drain electrode layer). Accordingly, mobility reduction of the TFT can be sufficiently suppressed. Further, change of switching characteristics due to contact resistance can be suppressed.

Moreover, in the case where the lower source electrode layer (or the lower drain electrode layer) is formed using the same material layer as the material layer of the gate electrode layer, a high-performance TFT can be provided without increasing the number of manufacturing steps.

As described above, in accordance with the present invention, an oxide semiconductor device in which the effect of the contact resistance is reduced can be provided. An oxide semiconductor device with high characteristics can be provided at low cost.

BEST MODE FOR CARRYING OUT THE INVENTION

Figure 1A:
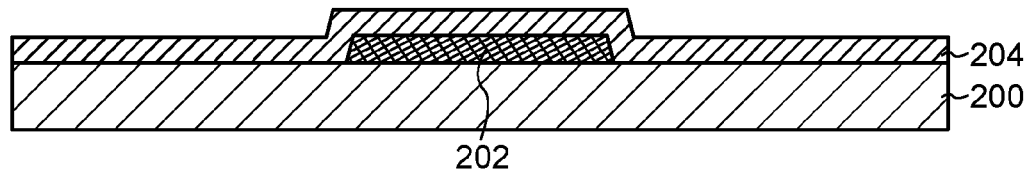
FIGS. 1A to 1E are views illustrating a method for manufacturing a semiconductor device of Embodiment 1.

Embodiments will be described using drawings in detail. Note that the present invention is not limited to the description of the embodiments given below, and it is apparent to those skilled in the art that the modes and details can be modified in various ways without departing from the spirit of the present invention. Embodiments can be combined as appropriate to be implemented. Note that the same reference numerals refer to the same portions or portions having similar functions throughout the structure of the present invention described below, and the description thereof is not repeated.

[Embodiment 1]

In Embodiment 1, an example of a method for manufacturing a semiconductor device of the present invention will be described with reference to drawings.

First, a gate electrode layer 202 is formed over a substrate 200, and a gate insulating layer 204 is formed over the gate electrode layer 202 (see FIG. 1A).

A substrate having an insulating surface is used as the substrate 200; for example, a glass substrate can be used. It is preferable that the glass substrate be a non-alkali glass substrate. As a material of the non-alkali glass substrate, a glass material such as aluminosilicate glass, aluminoborosilicate glass, or barium borosilicate glass is used, for example. As other examples of the substrate 200, the following can be given: an insulating substrate made of an insulator, such as a ceramic substrate, a quartz substrate, or a sapphire substrate; a semiconductor substrate made of a semiconductor material such as silicon, the surface of which is covered by an insulating material; and a conductive substrate made of a conductor such as metal or stainless-steel, the surface of which is covered by an insulating material. Alternatively, a plastic substrate can be used as long as it can resist thermal treatment in the manufacturing process.

The gate electrode layer 202 can be formed as follows: a conductive film is formed entirely over the substrate 200 and etched by a photolithography method. Although the gate electrode layer 202 is formed on the surface of the substrate 200 in FIG. 1A, a film which functions as a base may be formed over the substrate 200 and the gate electrode layer 202 may be formed thereover. The gate electrode layer 202 includes an electrode and a wiring formed using the above-described conductive layer, such as a gate wiring.

It is preferable that the etching for forming the gate electrode layer be performed to taper the edge portion of the gate electrode layer 202 so as to increase the coverage with the gate insulating layer 204 formed later and prevent disconnection. For example, it is preferable that the edge portion have a tapered angle equal to or greater than 20° and less than 90°. Note that the "tapered angle" means an inclination angle formed by the side surface and the bottom surface of the layer having a tapered shape (the gate electrode layer 202 in Embodiment 1) when being observed in the cross-sectional direction (the direction of a plane which is perpendicular to the surface of the substrate 200). That is, the "tapered angle" corresponds to the angle of the bottom edge portion of the gate electrode layer 202 when being observed in the cross-sectional direction.

The gate electrode layer 202 is preferably formed using a conductive material such as aluminum (Al), copper (Cu), molybdenum (Mo), tungsten (W), or titanium (Ti). However, aluminum has the disadvantages of low heat resistance, being easily corroded, and the like; thus, when aluminum is used as a wiring or an electrode, it is preferable to combine aluminum with a conductive material having heat resistance.

As the conductive material having heat resistance, any of the following materials may be used: a metal containing an element selected from titanium (Ti), tantalum (Ta), tungsten (W), molybdenum (Mo), chromium (Cr), neodymium (Nd), and scandium (Sc); an alloy containing any of these above elements as a component; an alloy containing some or all of these elements in combination; and a nitride containing any of these above elements as a component. Such a conductive material having heat resistance and aluminum (or copper) may be stacked to form a wiring and an electrode.

The gate electrode layer 202 can be formed selectively over the substrate 200 by a droplet discharge method, a screen-printing method, or the like, as well.

The gate insulating layer 204 can be formed using silicon oxide, silicon oxynitride, silicon nitride, silicon nitride oxide, aluminum oxide, tantalum oxide, or the like. A plurality of films using the above material may be stacked to form the gate insulating layer 204. It is preferable that these films be formed to have a thickness equal to or greater than 50 nm and equal to or less than 250 nm by a sputtering method or the like. For example, as the gate insulating layer 204, a silicon oxide film can be formed to have a thickness of 100 nm by a sputtering method.

Note that in this specification, oxynitride refers to a substance that contains a larger amount (number of atoms) of oxygen than nitrogen. For example, silicon oxynitride is a substance that contains oxygen, nitrogen, silicon, and hydrogen at concentrations ranging from 50 at. % to 70 at. % inclusive, 0.5 at. % to 15 at. % inclusive, 25 at. % to 35 at. % inclusive, and 0.1 at. % to 10 at. % inclusive, respectively. Further, nitride oxide refers to a substance that contains a large amount (number of atoms) of nitrogen than oxygen. For example, silicon nitride oxide is a substance that contains oxygen, nitrogen, silicon, and hydrogen at concentrations ranging from 5 at. % to 30 at. % inclusive, from 20 at. % to 55 at. % inclusive, from 25 at. % to 35 at. % inclusive, and from 10 at. % to 25 at. % inclusive, respectively. Note that the above ranges are ranges in the case where measurement is performed using Rutherford backscattering spectrometry (RBS) or hydrogen forward scattering spectrometry (HFS). Moreover, the total for the content ratio of the constituent elements is maximum at 100 at. %.

Figure 1B:
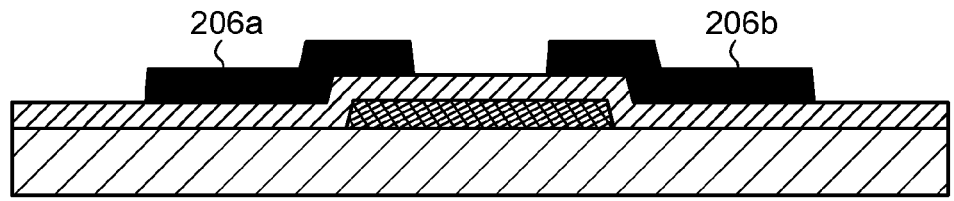

Next, a first source electrode layer 206a and a first drain electrode layer 206b are formed over the gate insulating layer 204 (see FIG. 1B).

The first source electrode layer 206a and the first drain electrode layer 206b can be formed as follows: a conductive film is formed over the gate insulating layer 204 and etched by a photolithography method. As an example, described in Embodiment 1 is the case where parts of the first source electrode layer 206a and the first drain electrode layer 206b overlap with the gate electrode layer 202 with the gate insulating layer 204 interposed therebetween.

The first source electrode layer 206a and the first drain electrode layer 206b can be formed by a sputtering method, a vacuum evaporation method, or the like using metal containing an element selected from aluminum (Al), copper (Cu), titanium (Ti), tantalum (Ta), tungsten (W), molybdenum (Mo), chromium (Cr), neodymium (Nd), and scandium (Sc), an alloy containing the aforementioned element as its component, or nitride containing the aforementioned element as its component.

For example, each of the first source electrode layer 206a and the first drain electrode layer 206b can be formed using a single layer structure of a molybdenum film or a titanium film. Each of the first source electrode layer 206a and the first drain electrode layer 206b may be formed using a stacked-layer structure as well. For example, the following can be given: a stacked-layer structure of an aluminum film and a titanium film; a three-layer structure in which a titanium film, an aluminum film, and a titanium film are stacked in order; and a three-layer structure in which a molybdenum film, an aluminum film, and a molybdenum film are stacked in order. As the aluminum film used in the stacked-layer structure, an aluminum containing neodymium (Al—Nd) film may be used. Alternatively, each of the first source electrode layer 206a and the first drain electrode layer 206b may be formed using a single-layer structure of an aluminum film containing silicon.

The first source electrode layer 206a and the first drain electrode layer 206b can be formed selectively over the substrate 200 by a droplet discharge method, a screen-printing method, or the like, as well.

Depending on the driving method of a transistor, the first source electrode layer 206a may function as a drain electrode and the first drain electrode layer 206b may function as a source electrode. The source and the drain can be changed each other depending on the function.

Although not shown in the drawing in Embodiment 1, surface treatment may be performed on the gate insulating layer 204, the first source electrode layer 206a, and the first drain electrode layer 206b after the above steps. As examples of the surface treatment, plasma treatment using an inert gas and/or a reaction gas, and the like can be given.

Plasma treatment can be performed as follows, for example: an inert gas such as an argon (Ar) gas is introduced into a vacuum chamber and a bias voltage is applied to an object to be processed, so that plasma is generated. In the plasma, electrons and cations of Ar exist, and the cations of Ar are accelerated in a cathode direction when the Ar gas is introduced into the chamber. The accelerated cations of Ar collide with the surfaces of the gate insulating layer 204, the first source electrode layer 206a, and the first drain electrode layer 206b which are formed over the substrate 200, thereby performing sputter-etching on the surfaces, so that the quality of the surfaces of the gate insulating layer 204, the first source electrode layer 206a, and the first drain electrode layer 206b can be changed. Such plasma treatment may be referred to as reverse-sputtering.

Such plasma treatment with the bias voltage applied on the substrate 200 side enables the sputter-etching to be performed effectively on the surfaces of the gate insulating layer 204, the first source electrode layer 206a, and the first drain electrode layer 206b. Further, in the case where the surface of the gate insulating layer 204 has roughness, sputter-etching is performed on a projection preferentially, so that the surface flatness of the gate insulating layer 204 can be improved.

As examples of a gas used for the plasma treatment, there are a helium gas and the like in addition to an argon gas. The plasma treatment may be performed in an atmosphere in which oxygen, hydrogen, nitrogen, or the like is added to an argon gas or a helium gas. Alternatively, the plasma treatment may be performed in an atmosphere in which $Cl_2$, $CF_4$, or the like is added to an argon gas or a helium gas.

Figure 1C:
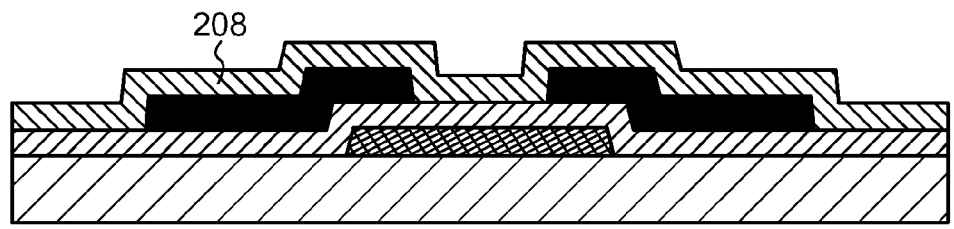

Next, an oxide semiconductor layer 208 is formed to cover the gate insulating layer 204, the first source electrode layer 206a, and the first drain electrode layer 206b (see FIG. 1C).

The oxide semiconductor layer 208 can be formed using an In—Ga—Zn—O-based non-single-crystal film. For example, the oxide semiconductor layer 208 can be formed by a sputtering method using an oxide semiconductor target containing In, Ga, and Zn ($In_2O_3$:$Ga_2O_3$:ZnO=1:1:1). For example, the sputtering can be performed under the following condition: the distance between the substrate 200 and the target is 30 to 500 mm; the pressure is 0.1 to 2.0 Pa; the direct-current (DC) power source is 0.25 to 5.0 kW; the temperature is 20 to 100° C.; and the atmosphere is an argon atmosphere, an oxygen atmosphere, or a mixed atmosphere of argon and oxygen.

Note that it is preferable to use a pulsed direct-current (DC) power source with which generation of dust can be suppressed and thickness distribution can be evened. Further, the case where the oxide semiconductor layer 208 is formed without exposure to the air after the above-described plasma treatment is performed can suppress the attachment of dust or moisture to the interface between the gate insulating layer 204 and the oxide semiconductor layer 208. Further, it is preferable that the thickness of the oxide semiconductor layer 208 be about 5 to 200 nm.

As the above-described sputtering method, an RF sputtering method using a high-frequency power source as a sputtering power source, a DC sputtering method using a direct-current power source, a pulsed DC sputtering method in which a direct-current bias is applied in the form of a pulse, or the like can be used.

In the case where the above-described plasma treatment is used as the surface treatment, it is preferable that the plasma treatment and the formation of the oxide semiconductor layer 208 be performed continuously in the same chamber. Accordingly, the attachment of impurities to the surfaces of the gate insulating layer 204, the first source electrode layer 206a, and the first drain electrode layer 206b and the formation of a native oxide film or the like on the surfaces of the first source electrode layer 206a and the first drain electrode layer 206b can be suppressed.

Figure 1D:
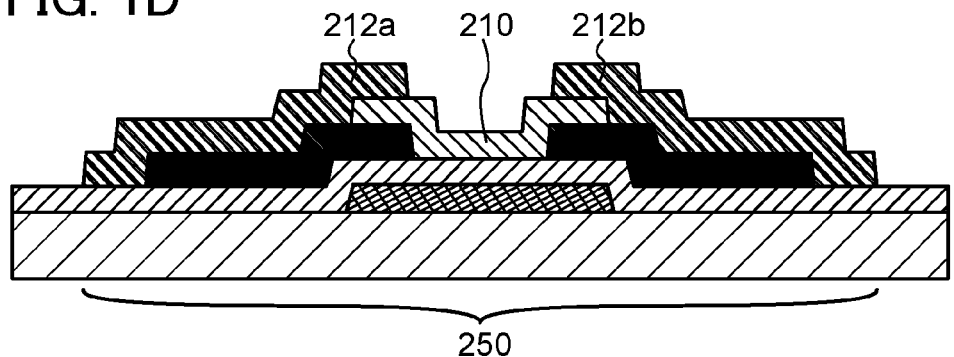

Next, the oxide semiconductor layer 208 is selectively etched to form an island-shaped oxide semiconductor layer 210 which is in contact with the first source electrode layer 206a and the first drain electrode layer 206b at least partly, and then, a second source electrode layer 212a and a second drain electrode layer 212b which are in contact with parts of the island-shaped oxide semiconductor layer 210 are formed (see FIG. 1D). The second source electrode layer 212a and the second drain electrode layer 212b can be formed using the same or similar structures, materials, and methods as/to the structures, materials, and methods of the first source electrode layer 206a and the first drain electrode layer 206b. That is, the second source electrode layer 212a and the second drain electrode layer 212b can be formed as follows: a conductive film is formed using a predetermined material, and is etched by a photolithography method. Described in Embodiment 1 is the case where materials of the first source electrode layer 206a and the first drain electrode layer 206b are different from materials of the second source electrode layer 212a and the second drain electrode layer 212b; however, the same material can be used to form them.

Here, the first source electrode layer 206a is electrically connected to the second source electrode layer 212a whereas the first drain electrode layer 206b is electrically connected to the second drain electrode layer 212b. In order to perform the electrical connection efficiently, reverse sputtering may be performed on the first source electrode layer 206a, the first drain electrode layer 206b, and the island-shaped oxide semiconductor layer 210.

Through the above steps, a transistor 250 using the island-shaped oxide semiconductor layer 210 as a channel formation region can be formed.

Note that in Embodiment 1, the length of the channel formation region (a so-called channel length) is controlled by the first source electrode layer 206a and the first drain electrode layer 206b in consideration that mainly the bottom surface of the island-shaped oxide semiconductor layer 210 contributes to the electrical conduction; however, the structure of the transistor 250 is not limited thereto. The channel length may be controlled by the second source electrode layer 212a and the second drain electrode layer 212b.

After the formation of the island-shaped oxide semiconductor layer 210, it is preferable to perform thermal treatment at 100 to 800° C., typically 200 to 400° C. For example, thermal treatment is performed for 1 hour at 350° C. in a nitrogen atmosphere. By this thermal treatment, atomic rearrangement of the In—Ga—Zn—O-based oxide semiconductor which forms the island-shaped oxide semiconductor layer 210 is performed. This thermal treatment (including light annealing) is important in that distortion which blocks carrier movement in the island-shaped oxide semiconductor layer 210 can be released. The timing of performing the above-described thermal treatment is not particularly limited as long as it is after the formation of the oxide semiconductor layer 208.

Oxygen radical treatment may be performed on the island-shaped oxide semiconductor layer 210. The oxygen radical treatment makes the transistor 250 be normally off easily. In addition, the radical treatment can repair damage due to the etching of the island-shaped oxide semiconductor layer 210. The radical treatment can be performed in an atmosphere of $O_2$, $N_2O$, or $N_2$, He, or Ar containing oxygen. The radical treatment may also be performed in an atmosphere in which $Cl_2$ and $CF_4$ are added to the above atmosphere. Note that it is preferable that the radical treatment be performed without applying a bias voltage to the substrate 200 side.

Figure 1E:
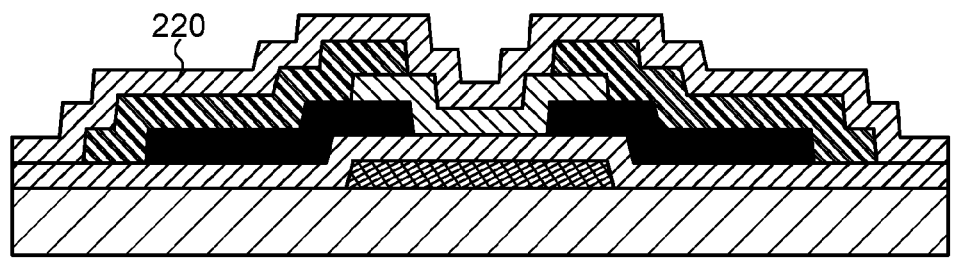

Then, a protective insulating layer 220 is formed to cover the transistor 250 including the island-shaped oxide semiconductor layer 210, the second source electrode layer 212a, the second drain electrode layer 212b, and the like (see FIG. 1E). The protective insulating layer 220 may be formed of a single layer or a stacked layer using silicon oxide, silicon nitride, silicon oxynitride, silicon nitride oxide, aluminum oxide, aluminum nitride, aluminum oxynitride, aluminum nitride oxide, or the like by a CVD method, a sputtering method, or the like. Alternatively, a film using an organic material having heat resistance such as polyimide, acrylic, benzocyclobutene, polyamide, or epoxy may be formed by a spin-coating method, a droplet discharging method (e.g., an ink-jet method, a screen printing, or an offset printing), or the like. As an alternative to the organic materials listed above, a low-dielectric constant material (a low-k material), a siloxane-based resin, PSG (phosphosilicate glass), BPSG (borophosphosilicate glass), or the like can be used. Note that a siloxane resin is a resin formed from a siloxane material as a starting material and having the bond of Si—O—Si.

In Embodiment 1, a silicon oxide film is formed by a sputtering method, as the protective insulating layer 220.

After that, various electrodes and wirings are formed, thereby completing a semiconductor device including the transistor 250.

Two source electrode layers (or drain electrode layers) are provided above and below an oxide semiconductor layer which functions as an active layer of a transistor to interpose the oxide semiconductor layer therebetween as described in Embodiment 1, thereby largely decreasing the contact resistance between the oxide semiconductor layer and the source electrode layer (or the drain electrode layer). Accordingly, mobility reduction of the TFT can be sufficiently suppressed. Further, change of switching characteristics due to contact resistance can be suppressed.

Thus, according to this embodiment, an oxide semiconductor device in which the adverse effect of the contact resistance is reduced can be provided. Note that this embodiment can be implemented in combination with any of the other embodiments and example as appropriate.

[Embodiment 2]

In Embodiment 2, an example other than Embodiment 1 of the method for manufacturing a semiconductor device will be described with reference to drawings. Note that a manufacturing process of a semiconductor device in Embodiment 2 is the same as other embodiments in many points thereof. Therefore, description on the same points is omitted and different points will be described in detail below.

Figure 2A:
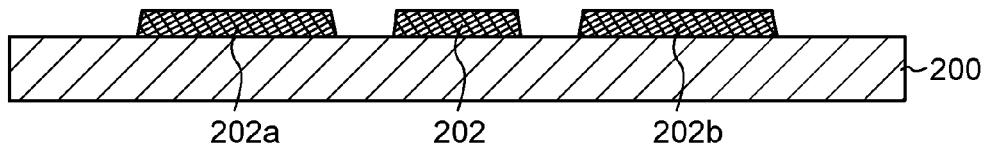
FIGS. 2A to 2E are views illustrating a method for manufacturing a semiconductor device of Embodiment 2.

First, over a substrate 200 having an insulating surface, a gate electrode layer 202, a first source electrode layer 202a, and a first drain electrode layer 202b are formed (see FIG. 2A). In Embodiment 2, the gate electrode layer 202, the first source electrode layer 202a, and the first drain electrode layer 202b are formed using the same material layer as each other.

As the material layer, a conductive film using a conductive material such as aluminum (Al), copper (Cu), molybdenum (Mo), tungsten (W), or titanium (Ti) is preferably used. However, aluminum has the disadvantages of low heat resistance, being easily corroded, and the like; thus, when aluminum is used as a wiring or an electrode, it is preferable to combine aluminum with a conductive material having heat resistance. As for the conductive material having heat resistance, a material of the substrate 200, and a structure, a manufacturing method, and the other details of the gate electrode layer 202, Embodiment 1 can be referred to.

Figure 2B:
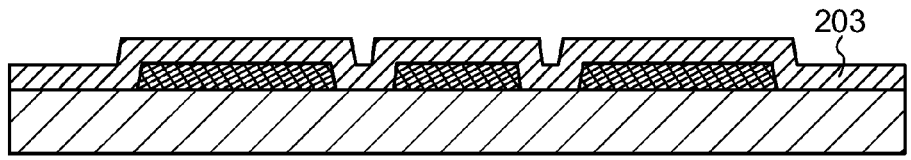
Figure 2C:
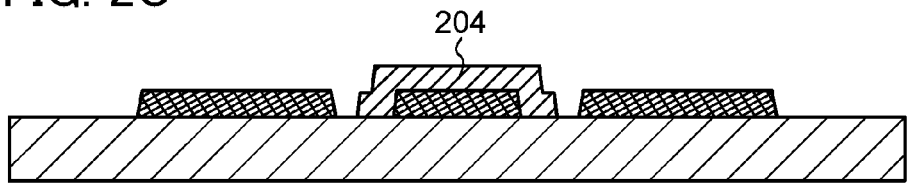

Next, an insulating layer 203 is formed to cover the gate electrode layer 202, the first source electrode layer 202a, and the first drain electrode layer 202b (see FIG. 2B). Then, the insulating layer 203 is etched to form a gate insulating layer 204 and expose the first source electrode layer 202a and the first drain electrode layer 202b (see FIG. 2C).

Note that it is necessary to form an opening in the insulating layer 203 in order to realize connection between the gate electrode layer 202 or a wiring (not shown) formed using the same material layer as the material layer of the gate electrode layer 202 and another wiring. By performing the formation of the opening and the exposure of the first source electrode layer 202a and the first drain electrode layer 202b in one step, the increase of the number of masks and the increase of the number of steps can be suppressed, so that the manufacturing cost can be suppressed.

Embodiment 1 can be referred to for the details of the substrate 200. In addition, Embodiment 1 can be referred to also for a material, a manufacturing method, and the other details of the gate insulating layer 204 (and the insulating layer 203 from which the gate insulating layer 204 is formed).

Figure 2D:
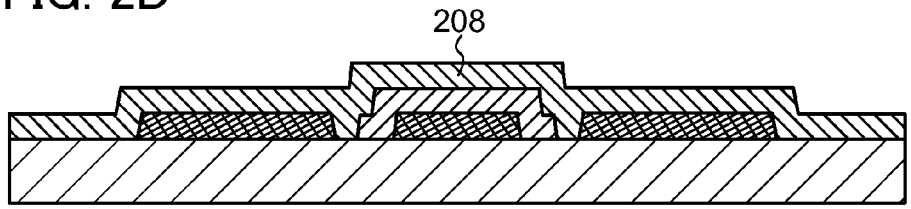

Next, an oxide semiconductor layer 208 is formed to cover the gate insulating layer 204, the first source electrode layer 202a, and the first drain electrode layer 202b (see FIG. 2D).

As for the details of the oxide semiconductor layer 208, Embodiment 1 can be referred to.

Figure 2E:
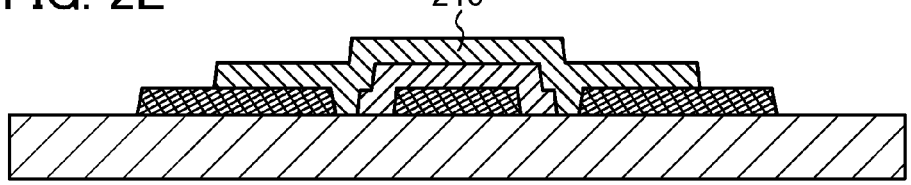

After that, the oxide semiconductor layer 208 is selectively etched to form an island-shaped oxide semiconductor layer 210 (see FIG. 2E). Here, it is preferable to etch the oxide semiconductor layer 208 such that the first source electrode layer 202a and the first drain electrode layer 202b are exposed at least partly.

Figure 3A:
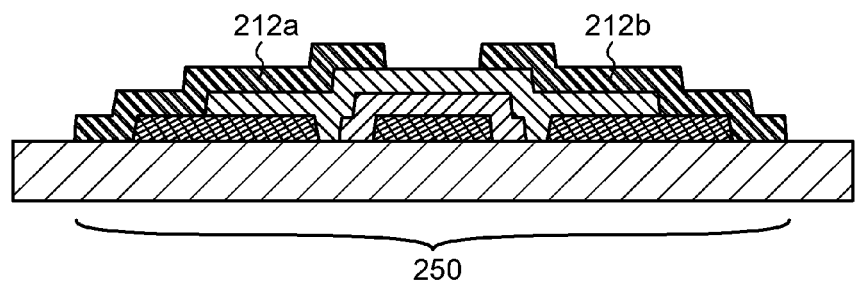
FIGS. 3A and 3B are views illustrating a method for manufacturing a semiconductor device of Embodiment 2.

After the above-described etching, a second source electrode layer 212a and a second drain electrode layer 212b are formed (see FIG. 3A). The second source electrode layer 212a and the second drain electrode layer 212b can be formed as follows: a conductive film is formed to cover the first source electrode layer 202a, the first drain electrode layer 202b, and the island-shaped oxide semiconductor layer 210 and is etched.

The second source electrode layer 212a and the second drain electrode layer 212b can be formed by a sputtering method, a vacuum evaporation method, or the like using metal containing an element selected from aluminum (Al), copper (Cu), titanium (Ti), tantalum (Ta), tungsten (W), molybdenum (Mo), chromium (Cr), neodymium (Nd), and scandium (Sc), an alloy containing the aforementioned element as its component, nitride containing the aforementioned element as its component, or the like.

For example, each of the second source electrode layer 212a and the second drain electrode layer 212b can be formed using a single layer structure of a molybdenum film or a titanium film. Each of the second source electrode layer 212a and the second drain electrode layer 212b may be formed using a stacked-layer structure as well. For example, the following can be given: a stacked-layer structure of an aluminum film and a titanium film; a three-layer structure in which a titanium film, an aluminum film, and a titanium film are stacked in order; and a three-layer structure in which a molybdenum film, an aluminum film, and a molybdenum film are stacked in order. As the aluminum film used in the stacked-layer structure, an aluminum containing neodymium (Al—Nd) film may be used. Alternatively, each of the second source electrode layer 212a and the second drain electrode layer 212b may be formed using a single-layer structure of a film of aluminum containing silicon.

The second source electrode layer 212a and the second drain electrode layer 212b can be formed selectively by a droplet discharge method, a screen-printing method, or the like, as well.

Here, the first source electrode layer 202a is electrically connected to the second source electrode layer 212a whereas the first drain electrode layer 202b is electrically connected to the second drain electrode layer 212b. Through the above steps, a transistor 250 using the island-shaped oxide semiconductor layer 210 as a channel formation region can be formed.

Figure 3B:
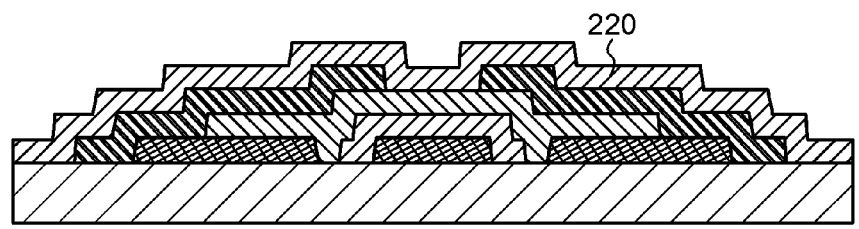

Then, a protective insulating layer 220 is formed to cover the transistor 250 including the island-shaped oxide semiconductor layer 210, the second source electrode layer 212a, the second drain electrode layer 212b, and the like (see FIG. 3B). As for the details of the protective insulating layer 220, Embodiment 1 can be referred to. After that, various electrodes and wirings are formed, thereby completing a semiconductor device including the transistor 250.

Two source electrode layers (or drain electrode layers) are provided above and below an oxide semiconductor layer which functions as an active layer of a transistor to interpose the oxide semiconductor layer therebetween as described in Embodiment 2, thereby largely decreasing the contact resistance between the oxide semiconductor layer and the source electrode layer (or the drain electrode layer). Accordingly, mobility reduction of the TFT can be sufficiently suppressed. Further, change of switching characteristics due to contact resistance can be suppressed.

Moreover, since the first source electrode layer 202a and the first drain electrode layer 202b are formed using the same material layer as the material layer of the gate electrode layer 202, a high-performance TFT can be provided without increasing the number of manufacturing steps. Accordingly, an oxide semiconductor device having high characteristics can be provided at low cost.

Thus, according to this embodiment, an oxide semiconductor device in which the adverse effect of the contact resistance is reduced can be provided. Note that this embodiment can be implemented in combination with any of the other embodiments and example as appropriate.

[Embodiment 3]

In Embodiment 3, an example other than Embodiments 1 and 2 of the method for manufacturing a semiconductor device will be described with reference to drawings. Note that a manufacturing process of a semiconductor device in Embodiment 3 is the same as other embodiments in many points thereof. Therefore, description on the same points is not repeated and different points will be described in detail below.

Figure 4A:
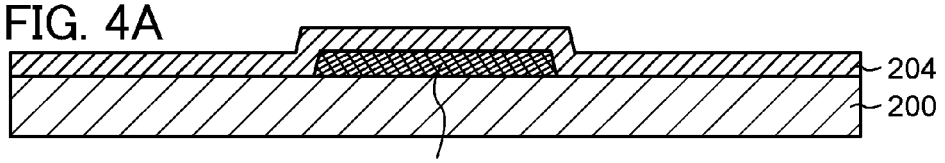
FIGS. 4A to 4E are views illustrating a method for manufacturing a semiconductor device of Embodiment 3.

First, a gate electrode layer 202 is formed over a substrate 200, and a gate insulating layer 204 is formed over the gate electrode layer 202 (see FIG. 4A). Embodiment 1 or the like can be referred to for a material of the substrate 200, a structure, a material, a manufacturing method of the gate electrode layer 202, and a structure, a material, and a manufacturing method of the gate insulating layer 204, and the other details.

Figure 4B:
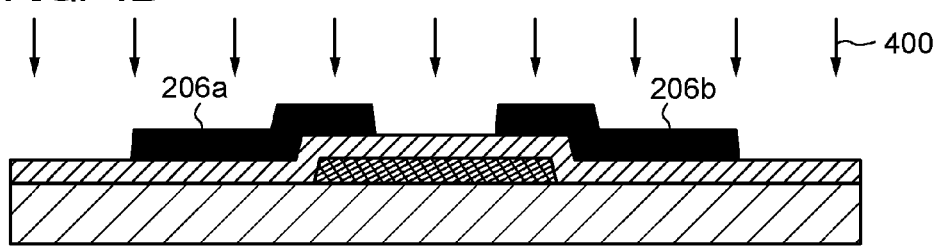

Next, a first source electrode layer 206a and a first drain electrode layer 206b which contain hydrogen are formed over the gate insulating layer 204 (see FIG. 4B).

As a method by which hydrogen is contained in the first source electrode layer 206a and the first drain electrode layer 206b, the following method can be given: a conductive film from which the first source electrode layer 206a and the like are formed is formed, and ion irradiation such as ion implantation or ion doping is performed to add hydrogen to the conductive film. As other examples thereof, the following methods can be given: a method in which hydrogen, water, or the like is introduced while a conductive film is formed; a method in which hydrogen plasma treatment is performed on a conductive film after the conductive film is formed; and the like. Described in Embodiment 3 is the case where irradiation with ions 400 is performed after the formation of a conductive film to add hydrogen.

As for the other details of the formation of the first source electrode layer 206a and the first drain electrode layer 206b, Embodiment 1 or the like can be referred to.

Figure 4C:
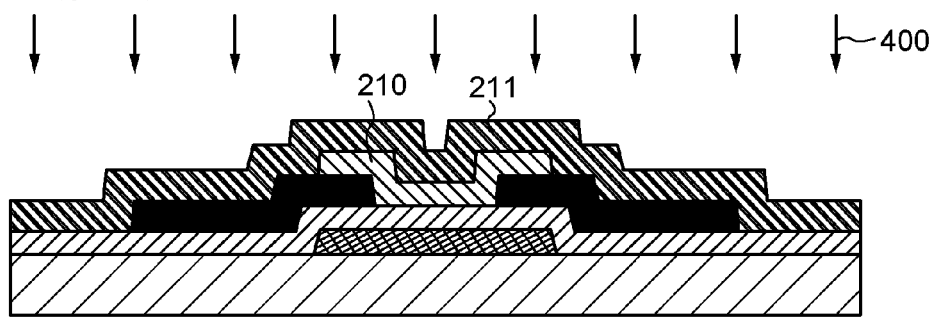

Next, an oxide semiconductor layer is formed to cover the gate insulating layer 204, the first source electrode layer 206a, and the first drain electrode layer 206b, and is selectively etched to form an island-shaped oxide semiconductor layer 210 so as to be in contact with the first source electrode layer 206a and the first drain electrode layer 206b at least partly. Then, after that, a conductive film 211 containing hydrogen is formed to cover the island-shaped oxide semiconductor layer 210 (see FIG. 4C). The conductive film 211 is a conductive film from which a second source electrode layer 212a and a second drain electrode layer 212b are formed later.

As a method by which hydrogen is contained in the conductive film 211, the following method can be given: the conductive film 211 is formed, and ion irradiation such as ion implantation or ion doping is performed to add hydrogen to the conductive film 211. As other examples thereof, the following methods can be given: a method in which hydrogen, water, or the like is introduced while the conductive film 211 is formed; a method in which hydrogen plasma treatment is performed on the conductive film 211 after the conductive film 211 is formed; and the like. Note that as one example of the method in which hydrogen, water, or the like is introduced while the conductive film 211 is formed, there is the following method: hydrogen or water is introduced into a chamber at the time of the film formation using a sputtering method, a CDV method, or the like such that hydrogen is contained in the film-formation atmosphere. Described in Embodiment 3 is the case where irradiation with the ions 400 is performed after the formation of the conductive film 211 to add hydrogen.

As for the details of the above-described oxide semiconductor layer, the island-shaped oxide semiconductor layer 210, and the like, Embodiment 1 or the like can be referred to. As for a structure, a material, a manufacturing method of the conductive film 211, the details of the second source electrode layer 212a and the second drain electrode layer 212b in Embodiment 1 (that is, the details of the first source electrode layer 206a and the first drain electrode layer 206b in Embodiment 1) can be referred to.

Figure 4D:
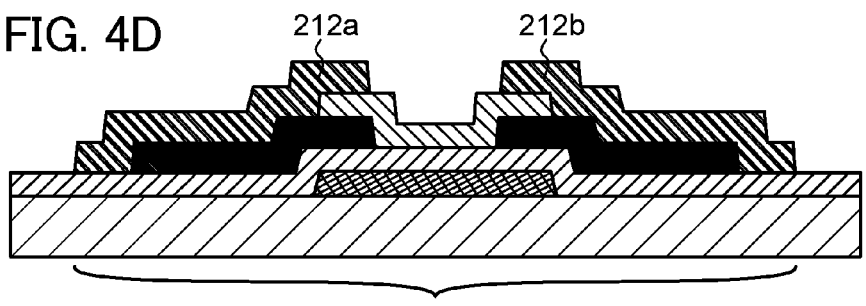

Next, the conductive film 211 is selectively etched to form the second source electrode layer 212a and the second drain electrode layer 212b such that the second source electrode layer 212a and the second drain electrode layer 212b are partly in contact with the island-shaped oxide semiconductor layer 210 (see FIG. 4D). As for the details of the second source electrode layer 212a and the second drain electrode layer 212b also, Embodiment 1 or the like can be referred to.

After that, thermal treatment is performed, so that hydrogen in the first source electrode layer 206a, the first drain electrode layer 206b, the second source electrode layer 212a, and the second drain electrode layer 212b is diffused into the island-shaped oxide semiconductor layer 210. Accordingly, the resistance in the regions (parts) where the island-shaped oxide semiconductor layer 210 is in contact with any of the first source electrode layer 206a, the first drain electrode layer 206b, the second source electrode layer 212a, and the second drain electrode layer 212b can be reduced. Specifically, in the island-shaped oxide semiconductor layer 210, the resistance in the regions (parts) where the island-shaped oxide semiconductor layer 210 is in contact with any of the first source electrode layer 206a, the first drain electrode layer 206b, the second source electrode layer 212a, and the second drain electrode layer 212b is lower than that of the channel formation region. For example, it is effective that the hydrogen concentration in each of the above-described regions (parts) is equal to or greater than $1 \times 10^{19}$ atoms/cm$^3$.

As examples of a method of the thermal treatment, various kinds of methods such as thermal treatment using a furnace, laser beam (lamp light) irradiation, or the like can be given; any method can be used as the thermal treatment as long as it can diffuse hydrogen. Through the above steps, a transistor 250 using the island-shaped oxide semiconductor layer 210 as a channel formation region can be formed.

Figure 4E:
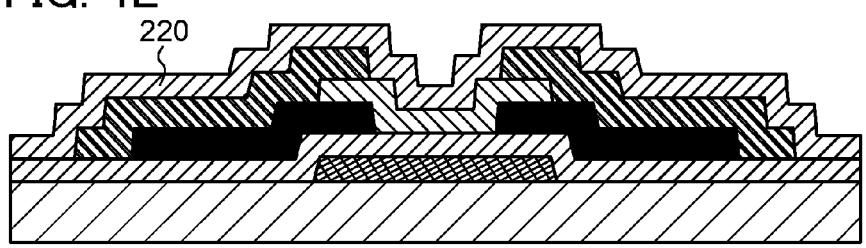

Next, a protective insulating layer 220 is formed to cover the transistor 250 including the island-shaped oxide semiconductor layer 210, the second source electrode layer 212a, the second drain electrode layer 212b, and the like (see FIG. 4E). As for the details of the protective insulating layer 220, Embodiment 1 or the like can be referred to.

After that, various electrodes and wirings are formed, thereby completing a semiconductor device including the transistor 250.

Note that although the thermal treatment for diffusing hydrogen is performed after the formation of the second source electrode layer 212a and the second drain electrode layer 212b, the present invention is not limited thereto. For example, the above-described thermal treatment may be performed after the formation of the protective insulating layer 220. On the other hand, in the case where the above-described thermal treatment is performed before the conductive film 211 is etched, hydrogen may be diffused also into the channel formation region in the island-shaped oxide semiconductor layer 210, which brings the conductivity of the channel formation region being too high. Therefore, it is preferable to perform the above-described thermal treatment after the etching of the conductive film 211.

Further, the above-described thermal treatment and thermal treatment on the island-shaped oxide semiconductor layer 210 (thermal treatment for releasing distortion in the oxide semiconductor layer) may be performed in the same step. By performing these two steps at the same time, the manufacturing cost can be reduced. In the case where the above-described thermal treatment is performed after the thermal treatment on the island-shaped oxide semiconductor layer 210, it is preferable to perform the thermal treatment on the island-shaped oxide semiconductor layer 210 under the condition in which too much hydrogen is not detached from the first source electrode layer 206a and the like.

As described above, according to the present invention, hydrogen is contained in the source electrode layer or the drain electrode layer, and then, the hydrogen is diffused into the oxide semiconductor layer by thermal treatment, so that the resistance in regions (parts) where the oxide semiconductor layer is in contact with any of the source electrode layer and the drain electrode layer can be reduced. In this manner, adverse effect of resistance increase due to contact resistance can be reduced, thereby providing a transistor having high characteristics.

Further, as described in Embodiment 3, the first source electrode layer (or drain electrode layer) and the second source electrode layer (or drain electrode layer) are provided above and below the oxide semiconductor layer to interpose the oxide semiconductor layer therebetween, thereby suppressing detachment of hydrogen which is diffused into the regions (parts) which are in contact with the source electrode layers (or the drain electrode layers) (the regions are a source region or a drain region), so that the conductivity of the regions can be kept to be higher. Furthermore, as compared to the case where a source electrode layer (or a drain electrode layer) is provided only one of above or below an oxide semiconductor layer, the amount of hydrogen which is diffused into an oxide semiconductor layer from a source electrode layer (or a drain electrode layer) can be increased, which provides such an advantageous that the conductivity of the region which is in contact with the source electrode layer (or the drain electrode layer) (the region is a source region or a drain region) can be easily increased. Note that although the structure in which hydrogen is contained in both of the first source electrode layer (or drain electrode layer) and the second source electrode layer (or drain electrode layer) is employed in Embodiment 3, the present invention is not limited thereto. Hydrogen may be contained in only one of the first source electrode layer (or drain electrode layer) or the second source electrode layer (or drain electrode layer) as long as the amount of hydrogen diffused from the source electrode layer (or the drain electrode layer) is sufficient.

Figure 5A:
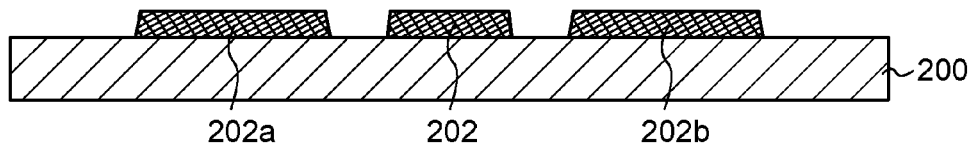
FIGS. 5A to 5E are views illustrating a method for manufacturing a semiconductor device of Embodiment 3.
Figure 5B:
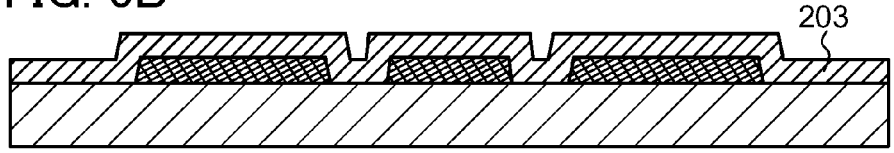
Figure 5C:
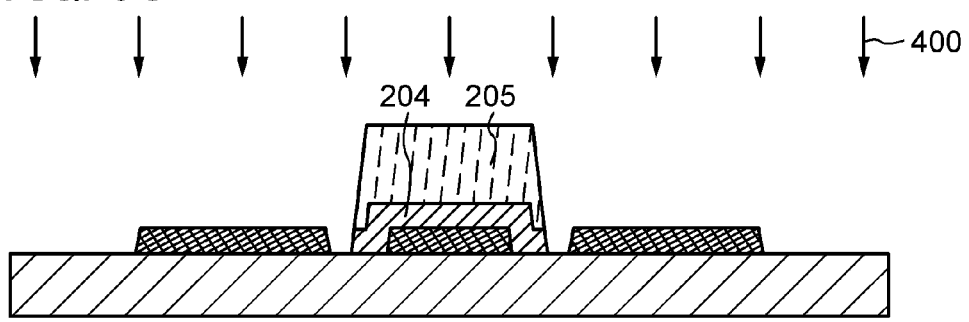
Figure 5D:
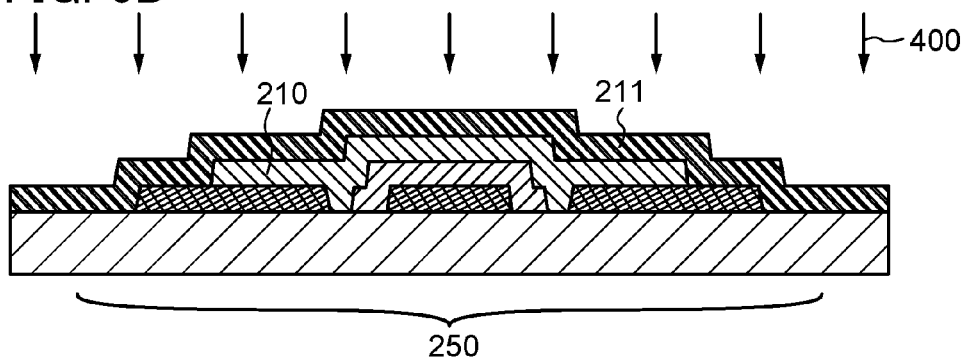
Figure 5E:
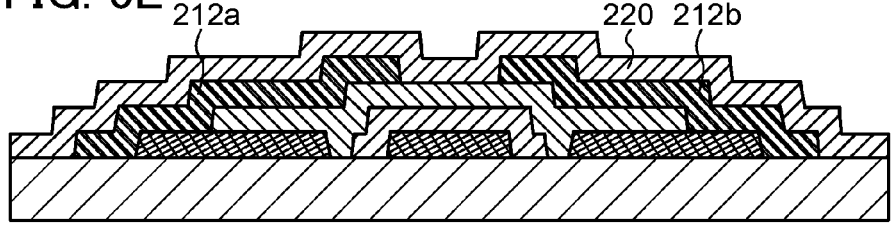

Although Embodiment 3 describes a deformed example of Embodiment 1 with reference to FIGS. 4A to 4E, the similar structure to the structure according to this embodiment can be attained as a deformed example of Embodiment 2. For example, a gate electrode layer 202, a first source electrode layer 202*a*, and a first drain electrode layer 202*b* are formed over a substrate 200 having an insulating surface (see FIG. 5A); an insulating layer 203 is formed to cover the gate electrode layer 202, the first source electrode layer 202*a*, and the first drain electrode layer 202*b* (see FIG. 5B); and then, the insulating layer 203 is etched to form a gate insulating layer 204 and the first source electrode layer 202*a* and the first drain electrode layer 202*b* are exposed. Then, using a mask 205 which is used at the time of the above etching, hydrogen is added selectively to the first source electrode layer 202*a* and the first drain electrode layer 202*b* (see FIG. 5C). After that, an island-shaped oxide semiconductor layer 210 is formed, and a conductive film 211 containing hydrogen is formed to cover the island-shaped oxide semiconductor layer 210 (see FIG. 5D). Then, the conductive film 211 is etched to form a second source electrode layer 212*a* and a second drain electrode layer 212*b*, and a protective insulating layer 220 is formed to cover a transistor 250 including them (see FIG. 5E). In this manner, the structure according to this embodiment can be attained also as a deformed example of Embodiment 2. As for the details of each component, Embodiment 2 or the like can be referred to.

In this manner, according to this embodiment, an oxide semiconductor device in which adverse effect of contact resistance is reduced can be provided. Note that this embodiment can be implemented in combination with any of the other embodiments and example as appropriate.

[Embodiment 4]

In Embodiment 4, the case where a thin film transistor is manufactured and a semiconductor device having a display function (the semiconductor device is also referred to as a display device) is manufactured using the thin film transistor in a pixel portion or a driver circuit will be described. Further, part or whole of the driver circuit and the pixel portion may be formed over the same substrate, thereby forming a system-on-panel.

The display device includes a display element. As the display element, a liquid crystal element (also referred to as a liquid crystal display element), a light-emitting element (also referred to as a light-emitting display element), or the like can be used. The light-emitting element includes, in its category, an element whose luminance is controlled by a current or a voltage, and specifically includes, in its category, an inorganic electroluminescent (EL) element, an organic EL element, and the like. As the display element, a display medium whose contrast is changed by electrical action, such as an electronic ink may be used.

The display device includes in its category a panel where a display element is sealed and a module where an IC or the like including a controller is mounted on the panel. In an element substrate included in the display device, a unit for supplying current to the display element is provided for each pixel portion. Specifically, the element substrate may be in a state provided with only a pixel electrode of the display element or a state after a conductive film to be a pixel electrode is formed and before the conductive film is etched.

Note that a display device in this specification means an image display device, a display device, a light source (including a lighting device), or the like. Further, the display device includes in its category any of the following modules: a module to which a connector such as a flexible printed circuit (FPC), tape automated bonding (TAB) tape, or a tape carrier package (TCP) is attached; a module having TAB tape or a TCP which is provided with a printed wiring board at the end thereof; a module having an integrated circuit (IC) which is directly mounted on a display element by a chip on glass (COG) method; and the like.

Figure 6A:
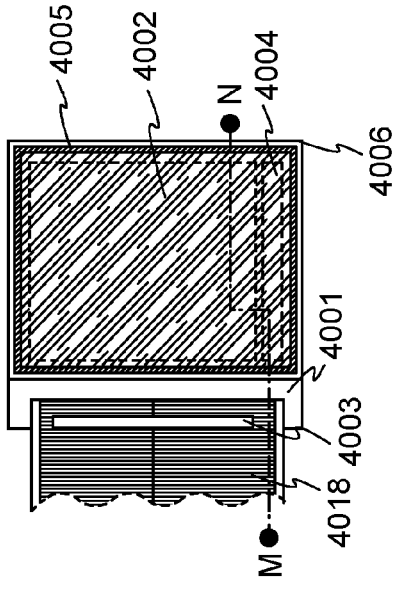
FIGS. 6A to 6C are views each illustrating a semiconductor device of Embodiment 4.
Figure 6B:
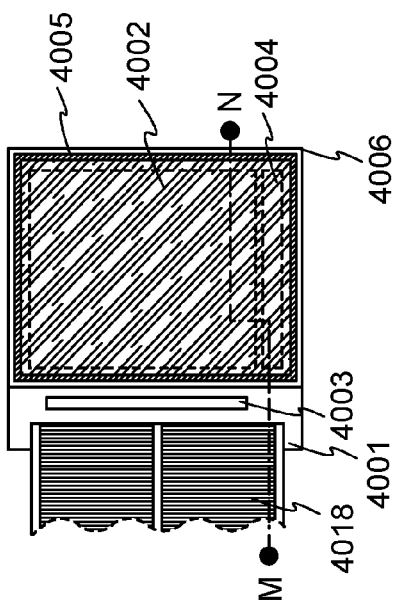
Figure 6C:
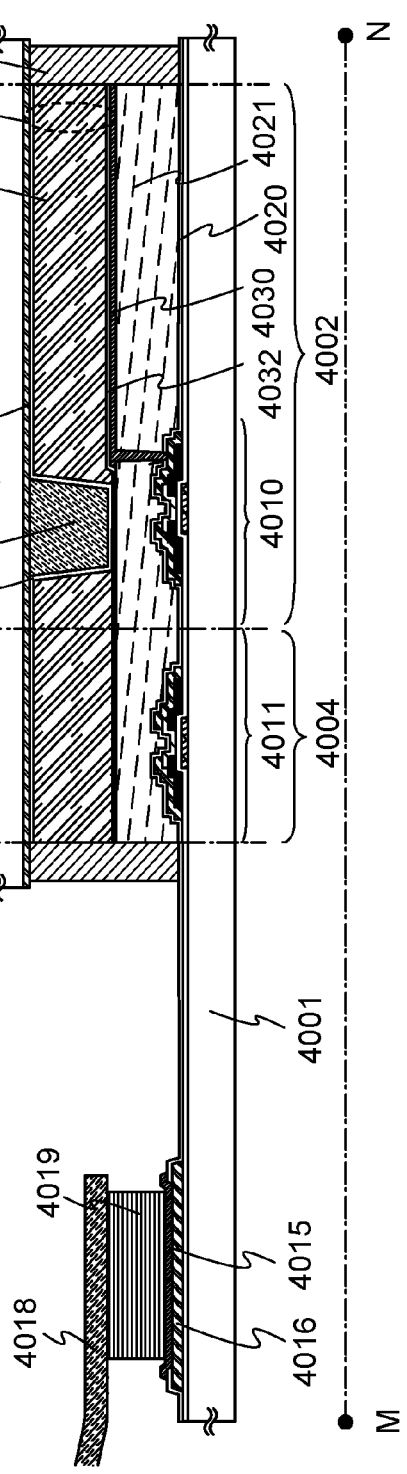

In this embodiment below, an example of a liquid crystal display device will be described. FIGS. 6A to 6C are plan views and a cross-sectional view of a panel in which high-performance thin film transistors 4010 and 4011 and a high-performance liquid crystal element 4013 formed over a first substrate 4001 are sealed with the use of a second substrate 4006 and a sealant 4005. FIGS. 6A and 6B are plan views and FIG. 6C is a cross-sectional view along M-N in each of FIGS. 6A and 6B.

The sealant 4005 is provided so as to surround a pixel portion 4002 and a scan line driver circuit 4004 provided over the first substrate 4001. Moreover, the second substrate 4006 is provided over the pixel portion 4002 and the scan line driver circuit 4004. That is, the pixel portion 4002 and the scan line driver circuit 4004 are sealed together with a liquid crystal layer 4008 by the first substrate 4001, the sealant 4005, and the second substrate 4006. Further, a signal line driver circuit 4003 which is formed using a single crystal semiconductor film or a polycrystalline semiconductor film over a substrate prepared separately is mounted in a region that is different from the region surrounded by the sealant 4005 over the first substrate 4001.

Note that the connection method of a driver circuit separately formed is not particularly limited: a COG method, a wire bonding method, a TAB method, or the like can be used as appropriate. FIG. 6A illustrates an example in which the signal line driver circuit 4003 is mounted by a COG method and FIG. 6B illustrates an example in which the signal line driver circuit 4003 is mounted by a TAB method.

Each of the pixel portion 4002 and the scan line driver circuit 4004 which are provided over the first substrate 4001 includes a plurality of thin film transistors. In FIG. 6C, the thin film transistor 4010 included in the pixel portion 4002 and the thin film transistor 4011 included in the scan line driver circuit 4004 are shown. Insulating layers 4020 and 4021 are provided over the thin film transistors 4010 and 4011.

High-performance thin film transistors as shown in Embodiments 1 to 3 can be used as the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed over the second substrate 4006. The liquid crystal element 4013 includes the pixel electrode layer 4030, the counter electrode layer 4031, and the liquid crystal layer 4008. Note that the pixel electrode layer 4030 and the counter electrode layer 4031 are provided with an insulating layer 4032 and an insulating layer 4033 respectively which function as alignment films, and interpose the liquid crystal layer 4008 with the insulating layers 4032 and 4033 interposed between the pixel electrode layer 4030 and the counter electrode layer 4031.

The first substrate 4001 and the second substrate 4006 can be formed using a substrate using glass, metal (typically, stainless steel), ceramics, plastics, or the like as a material. As for the plastic substrate, an FRP (fiberglass-reinforced plastics) plate, a PVF (polyvinyl fluoride) film, a polyester film, an acrylic resin film, or the like can be used. Further, a sheet in which aluminum foil is sandwiched by PVF films or polyester films can also be used as the substrate.

A columnar spacer 4035 is provided in order to control the distance (cell gap) between the pixel electrode layer 4030 and the counter electrode layer 4031. The columnar spacer 4035 is obtained by selectively etching an insulating film. Note that a spherical spacer may be used instead of the columnar spacer. The counter electrode layer 4031 is electrically connected to a common potential line, and the common potential line and the thin film transistor 4010 are provided over the same substrate. For example, the counter electrode layer 4031 can be electrically connected to the common potential line through conductive particles provided between the pair of substrates. The conductive particles may be contained in the sealant 4005.

Alternatively, blue-phase liquid crystal for which an alignment film is not necessary may be used. A blue-phase is one of the liquid crystal phases, which is generated just before a cholesteric phase changes into an isotropic phase while the temperature is increased. Since the blue-phase is generated within an only narrow range of temperature, a liquid crystal composition containing a chiral agent at greater than or equal to 5 wt % may be used so as to improve the temperature range. The liquid crystal composition which includes liquid crystal showing a blue-phase and a chiral agent has such characteristics that the response time is as short as 10 μs to 100 μs, alignment treatment is not needed because the liquid crystal composition has optical isotropy, and viewing angle dependency is small.

Although one example of a transmissive liquid crystal display device is described in this embodiment, the present invention is not limited thereto; a reflective liquid crystal display device or a semi-transmissive liquid crystal display device may be formed as well.

Further, in this embodiment, an example of the liquid crystal display device is described in which a polarizing plate is provided on the outer side of the substrate (on the viewer side) and a coloring layer and an electrode layer used for a display element are provided on the inner side of the substrate in this order; however, the polarizing plate may be provided on the inner side of the substrate. The stack structure of the polarizing plate and the coloring layer is not limited to that described in this embodiment and may be set as appropriate depending on materials of the polarizing plate and the coloring layer and conditions of the manufacturing process. Further, a light-blocking film serving as a black matrix may be provided.

Further, in this embodiment, the thin film transistors obtained in any of Embodiments 1 to 3 are covered with an insulating layer 4021 in order to reduce surface roughness of each thin film transistor. The insulating layer 4020 corresponds to the protective insulating layer in any of Embodiments 1 to 3.

The insulating layer 4021 can be formed using an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. The insulating layer 4021 may be formed by stacking a plurality of insulating films formed using these materials.

There is no particular limitation on the method for forming the insulating layer 4021: depending on the material, a sputtering method, an SOG method, a spin coating method, a dipping method, a spray coating method, a droplet discharge method (e.g., an inkjet method, screen printing, or offset printing), a doctor knife, a roll coater, a curtain coater, a knife coater, or the like can be used.

The pixel electrode layer 4030 and the counter electrode layer 4031 each can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition including a conductive high molecule (also referred to as a conductive polymer) may be used to form each of the pixel electrode layer 4030 and the counter electrode layer 4031. It is preferable that the pixel electrode formed using a conductive composition have a sheet resistance of less than or equal to $1.0 \times 10^4$ Ω/sq. and a light transmittance of less than or equal to 70% at a wavelength of 550 nm. Further, it is preferable that a conductive high molecule included in the conductive composition have a resistance of less than or equal to 0.1 Ω·cm.

As the conductive high molecule, a so-called π electron conjugated high molecule can be used. For example, polyaniline or a derivative thereof, polypyrrole or a derivative thereof, polythiophene or a derivative thereof, or a copolymer of two or more kinds of those materials can be given.

Various kinds of signals supplied to the signal line driver circuit 4003, the scan line driver circuit 4004, the pixel portion 4002, and the like are supplied from an FPC 4018.

A connection terminal electrode 4015 is formed using the same conductive film as the pixel electrode layer 4030 included in the liquid crystal element 4013. A terminal electrode 4016 is formed using the same conductive film as source and drain electrode layers included in the thin film transistors 4010 and 4011.

The connection terminal electrode 4015 is electrically connected to a terminal included in the FPC 4018 through an anisotropic conductive film 4019.

Although in the example shown in FIGS. 6A to 6C, the signal line driver circuit 4003 is formed separately and mounted on the first substrate 4001, this embodiment is not limited to this structure. The scan line driver circuit may be formed separately and then mounted, or only a part of the signal line driver circuit or a part of the scan line driver circuit may be formed separately and then mounted.

Figure 7:
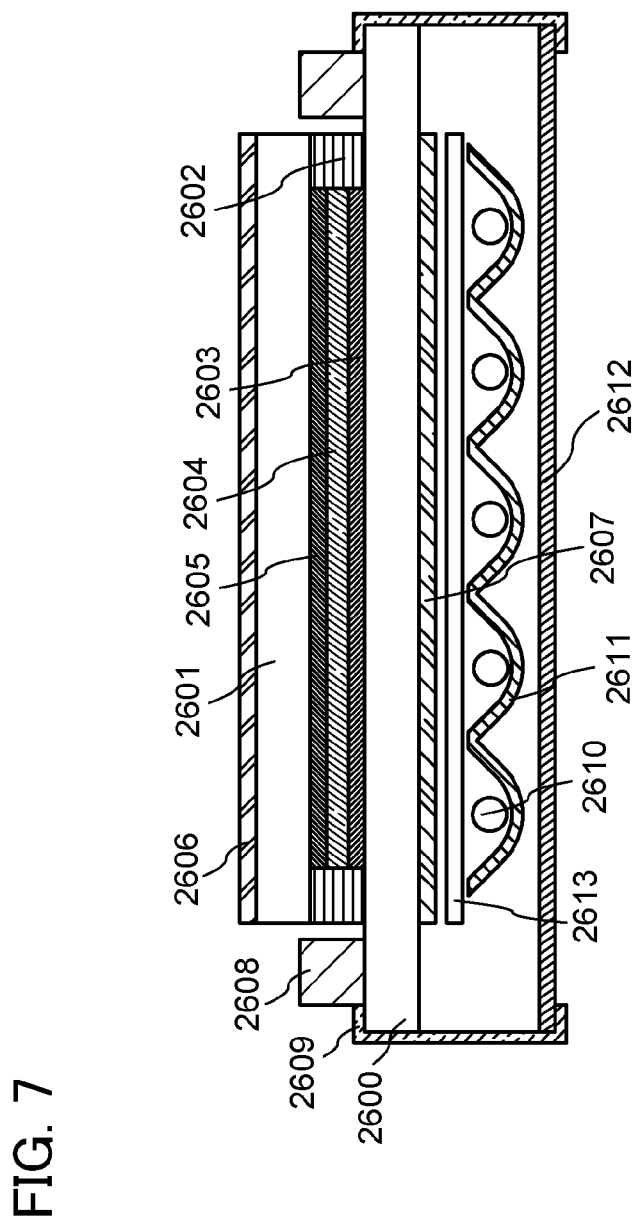
FIG. 7 is a view illustrating a semiconductor device of Embodiment 4.

FIG. 7 illustrates an example in which a TFT substrate 2600 is used for a liquid crystal module which corresponds to one mode of a semiconductor device.

In FIG. 7, the TFT substrate 2600 and a counter substrate 2601 are attached to each other with a sealant 2602, and between them, an element layer 2603 including a TFT and the like, a liquid crystal layer 2604 including an alignment film and/or a liquid crystal layer, a coloring layer 2605, a polarizing plate 2606, and the like are provided to form a display region. The coloring layer 2605 is necessary for color display. In the case of an RGB method, respective coloring layers corresponding to red, green, and blue are provided for pixels. The polarizing plate 2606, a polarizing plate 2607, and a diffusion plate 2613 are provided outside the TFT substrate 2600 and the counter substrate 2601. A light source includes a cold-cathode tube 2610 and a reflector 2611. A circuit substrate 2612 is connected to a wiring circuit portion 2608 of the TFT substrate 2600 via a flexible wiring board 2609, by which an external circuit such as a control circuit or a power source circuit is incorporated into the liquid crystal module. A retarder may be provided between the polarizing plate and the liquid crystal layer.

The following can be used as a diving method of a liquid crystal: a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (anti-ferroelectric liquid crystal) mode, and the like.

Through the above-described process, a high-performance liquid crystal display device can be manufactured. This embodiment can be implemented in combination with any of the other embodiments or example as appropriate.

[Embodiment 5]

In Embodiment 5, an active-matrix electronic paper that is one example of a semiconductor device will be described with reference to FIG. 8. A thin film transistor 650 included in the semiconductor device can be manufactured in a similar manner to the thin film transistor described in any of Embodiments 1 to 3.

Figure 8:
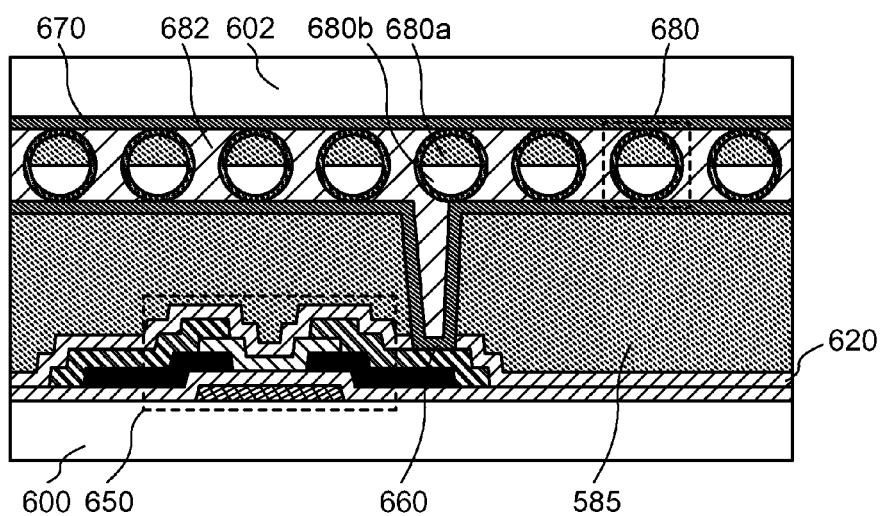
FIG. 8 is a view illustrating a semiconductor device of Embodiment 5.

The electronic paper shown in FIG. 8 is an example of a display device using a twisting ball display system. According to the twisting ball display system, spherical particles which are each colored separately in black and white are arranged between a first electrode layer and a second electrode layer, and a potential difference is generated between the first electrode layer and the second electrode layer to control the directions of the spherical particles, thereby performing display.

The thin film transistor 650 provided over a substrate 600 is the thin film transistor of the present invention and has a structure in which an oxide semiconductor layer is interposed between a source and drain electrode layers which are provided above the oxide semiconductor layer and a source and drain electrode layers which are provided below the oxide semiconductor layer. Note that the source electrode layer or the drain electrode layer is electrically connected to a first electrode layer 660 through a contact hole formed in an insulating layer 585 and a protective insulating layer 620. A second electrode layer 670 is provided for a substrate 602, and spherical particles 680 each having a black region 680a and a white region 680b are provided between the first electrode layer 660 and the second electrode layer 670. The space between the spherical particles 680 is filled with a filler 682 such as a resin (see FIG. 8). In FIG. 8, the first electrode layer 660 corresponds to a pixel electrode and the second electrode layer 670 corresponds to a common electrode. The second electrode layer 670 is electrically connected to a common potential line, and the common potential line and the thin film transistor 650 are provided over the same substrate.

Instead of twisting balls, an electrophoretic display element can also be used. In that case, for example, a microcapsule having a diameter of 10 μm to 20 μm which is filled with transparent liquid, positively charged white microparticles and negatively charged black microparticles and sealed is used. When an electric field is applied by the first electrode layer and the second electrode layer, the white microparticles and the black microparticles move to opposite sides from each other, so that a white or black image is displayed. The electrophoretic display element, which has higher reflectance compared with a liquid crystal display element, does not require an auxiliary light, and a display portion can be recognized even in a place where the brightness is not high enough. Moreover, the electrophoretic display element has also an advantage in that an image once displayed can be kept even when a power is not supplied to the display portion.

As described above, a high-performance electronic paper can be manufactured by using the present invention. This embodiment can be implemented in combination with any of the other embodiments and examples as appropriate.

[Embodiment 6]

In Embodiment 6, an example of a light-emitting display device using a light-emitting element using electroluminescence, as a semiconductor device will be described. Light-emitting elements using electroluminescence are classified according to whether a light-emitting material is an organic compound or an inorganic compound. In general, the former is referred to as an organic EL element, and the latter is referred to as an inorganic EL element.

In an organic EL element, when voltage is applied to the light-emitting element, electrons and holes are injected from a pair of electrodes into a layer containing a light-emitting organic compound and these carriers (electrons and holes) are recombined to emit light. From such a mechanism, the light-emitting element is called a light-emitting element of a current excitation type.

Inorganic EL elements are classified into a dispersion-type inorganic EL element and a thin-film-type inorganic EL element, depending on their element structures. A dispersion-type inorganic EL element includes a light-emitting layer in which particles of a light-emitting material are dispersed in a binder, and light emission mechanism thereof is donor-acceptor recombination light emission in which a donor level and an acceptor level are utilized. In a thin-film-type inorganic EL element, a light-emitting layer is sandwiched between dielectric layers, and further, the dielectric layers are sandwiched between electrodes. Light emission mechanism of the thin-film-type inorganic EL element is local light emission in which inner-shell electron transition of a metal ion is utilized. Description is made here on the case of using an organic EL element as a light-emitting element.

Figure 9A:
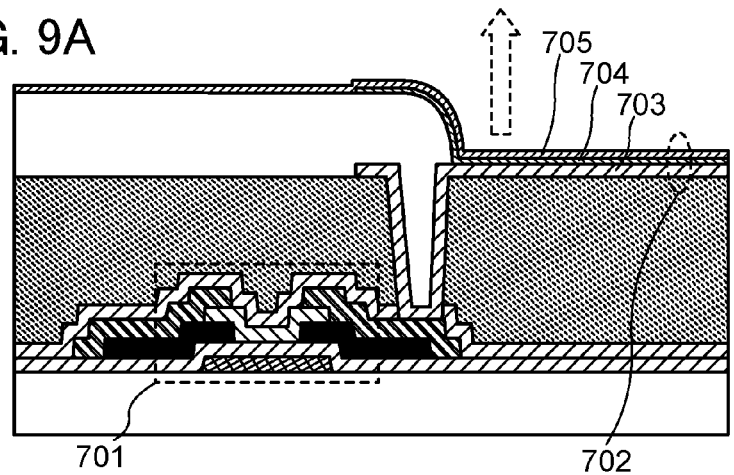
FIGS. 9A to 9C are views each illustrating a semiconductor device of Embodiment 6.
Figure 9B:
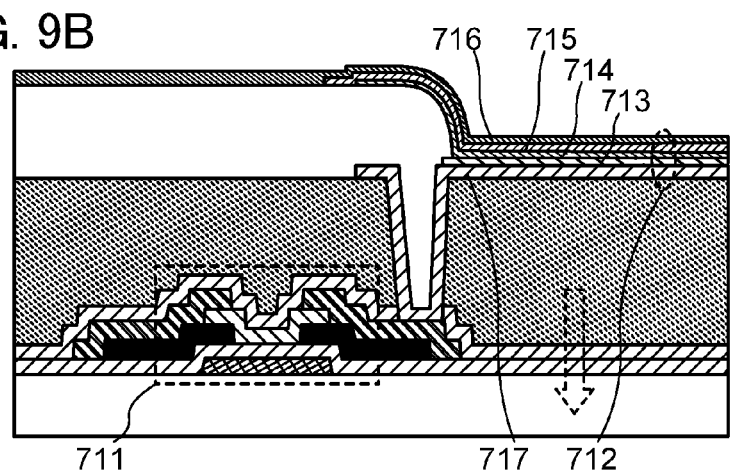
Figure 9C:
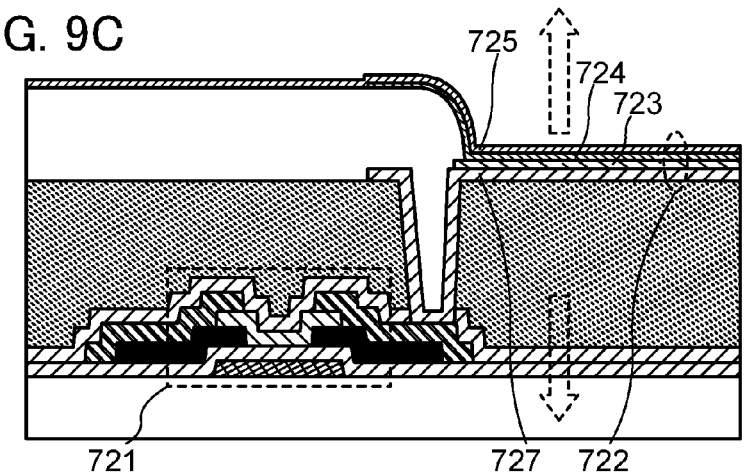

Structures of light-emitting elements are described using FIGS. 9A to 9C. A cross-sectional structure of a pixel is described by taking an n-channel driving TFT as an example. Respective TFTs 701, 711, and 721 used in semiconductor devices of FIGS. 9A, 9B, and 9C can be manufactured in a similar manner to the thin film transistor described in any of Embodiments 1 to 3.

In order to extract light, at least one of an anode and a cathode of the light-emitting element is transparent. Here, transparent means the state where transmittance of light at least emission wavelength is high enough. As the type of extracting light, there are the following in the case where a thin film transistor and a light-emitting element are formed over a substrate: a top-emission type (top-extraction type) in which light is extracted through a surface on the opposite side to the substrate; a bottom-emission type (bottom-extraction type) in which light is extracted through a surface on the substrate side; a dual-emission type (dual-extraction type) in which light is extracted through a surface on the substrate side and a surface on the opposite side to the substrate; and the like.

A top-emission-type light-emitting element is described using FIG. 9A.

FIG. 9A is a cross-sectional view of a pixel in the case where light emitted from a light-emitting element 702 is extracted through an anode 705 side. In FIG. 9A, a cathode 703 of the light-emitting element 702 is electrically connected to the TFT 7001 which is a driving TFT, and a light-emitting layer 704 and the anode 705 are stacked in this order over the cathode 703. The cathode 703 can be formed using a conductive film which has a low work function and reflects light. For example, Ca, Al, CaF, MgAg, or AlLi is preferably used to form the cathode 703. The light-emitting layer 704 may be formed of either a single-layer structure or a stacked-layer structure including a plurality of layers. In the case where the light-emitting layer 704 is formed of a plurality of layers, it is preferable to stack an electron injecting layer, an electron transporting layer, a light-emitting layer, a hole transporting layer, and a hole injecting layer in this order over the cathode 703; however, not all of them are necessarily provided. The anode 705 is formed using a light-transmitting conductive material. For example, the following light-transmitting conductive material may be used: indium oxide including tungsten oxide; indium zinc oxide including tungsten oxide; indium oxide including titanium oxide; indium tin oxide including titanium oxide; indium tin oxide (hereinafter, referred to as ITO); indium zinc oxide; or indium tin oxide to which silicon oxide is added.

An element having a structure in which the light-emitting layer 704 is interposed between the cathode 703 and the anode 705 can be called the light-emitting element 702. In the case of a pixel shown in FIG. 9A, light emitted from the light-emitting element 702 is extracted through the anode 705 side as indicated by an arrow.

Next, a bottom-emission-type light-emitting element is described using FIG. 9B.

FIG. 9B is a cross-sectional view of a pixel in the case where light emitted from a light-emitting element 712 is extracted through a cathode 713 side. In FIG. 9B, the cathode 713 of the light-emitting element 712 is formed over a light-transmitting conductive film 717 which is electrically connected to the driving TFT 711, and a light-emitting layer 714 and an anode 715 are stacked in this order over the cathode 713. In the case where the anode 715 has a light-transmitting property, a light-blocking film 716 may be provided to cover the anode 715. Similar to the case of FIG. 9A, the cathode 713 can be formed using a conductive material which has a low work function. However, the thickness of the cathode 713 is as thin as light can be transmitted (preferably, about 5 to 30 nm). For example, an aluminum film with a thickness of about 20 nm can be used as the cathode 713. The light-emitting layer 714 may be formed of a single-layer structure or a stacked-layer structure including a plurality of layers similarly to FIG. 9A. The anode 715 is not required to transmit light, but may be formed using a light-transmitting conductive material as in the case of FIG. 9A. For the light-blocking film 716, a metal or the like which reflects light can be used; however, it is not limited thereto. For example, a resin to which a black pigment is added or the like can be used.

An element having a structure in which the light-emitting layer 714 is interposed between the cathode 713 and the anode 715 can be called the light-emitting element 712. In the case of the pixel shown in FIG. 9B, light emitted from the light-emitting element 712 is extracted through the cathode 713 side as indicated by an arrow.

Next, a dual-emission-type light-emitting element is described using FIG. 9C.

In FIG. 9C, a cathode 723 of a light-emitting element 722 is formed over a light-transmitting conductive film 727 which is electrically connected to the driving TFT 721, and a light-emitting layer 724 and an anode 725 are stacked in this order over the cathode 723. The cathode 723 can be formed using a conductive material which has a low work function as in the case of FIG. 9A. However, the thickness of the cathode 723 is as thin as light can be transmitted. For example, Al with a thickness of 20 nm can be used as the cathode 723. The light-emitting layer 724 may be formed of a single-layer structure or a stacked-layer structure including a plurality of layers as in FIG. 9A. The anode 725 can be formed using a light-transmitting conductive material as in FIG. 9A.

An element having a structure in which the cathode 723, the light-emitting layer 724, and the anode 725 are overlapped with each other can be called the light-emitting element 722. In the case of a pixel shown in FIG. 9C, light emitted from the light-emitting element 722 is extracted through both of the anode 725 side and the cathode 723 side as indicated by arrows.

Although an organic EL element is described as a light-emitting element in this embodiment, it is also possible to provide an inorganic EL element as a light-emitting element as well. Further, although the example in which the thin film transistor (driving TFT) for controlling the operation of the light-emitting element is electrically connected to the light-emitting element is described in this embodiment, a current controlling TFT may be connected between the driving TFT and the light-emitting element. Further, although the example described in this embodiment is the case where an electrode that is electrically connected to the driving TFT is a cathode, the electrode that is electrically connected to the driving TFT may be an anode.

The semiconductor device described in this embodiment is not limited to the structure shown in any of FIGS. 9A to 9C and can be modified variously.

Figure 10A:
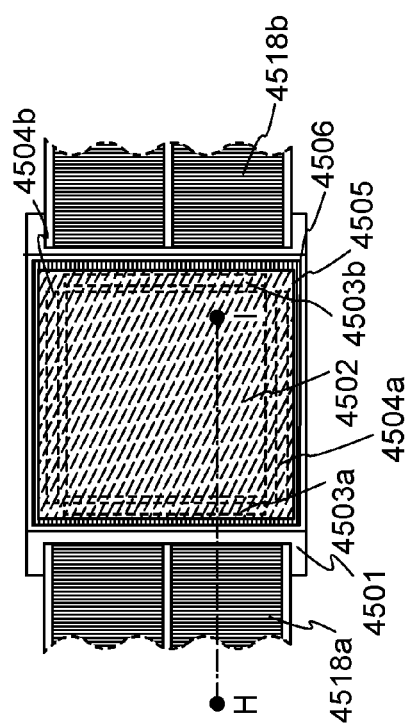
FIGS. 10A and 10B are views illustrating a semiconductor device of Embodiment 6.
Figure 10B:
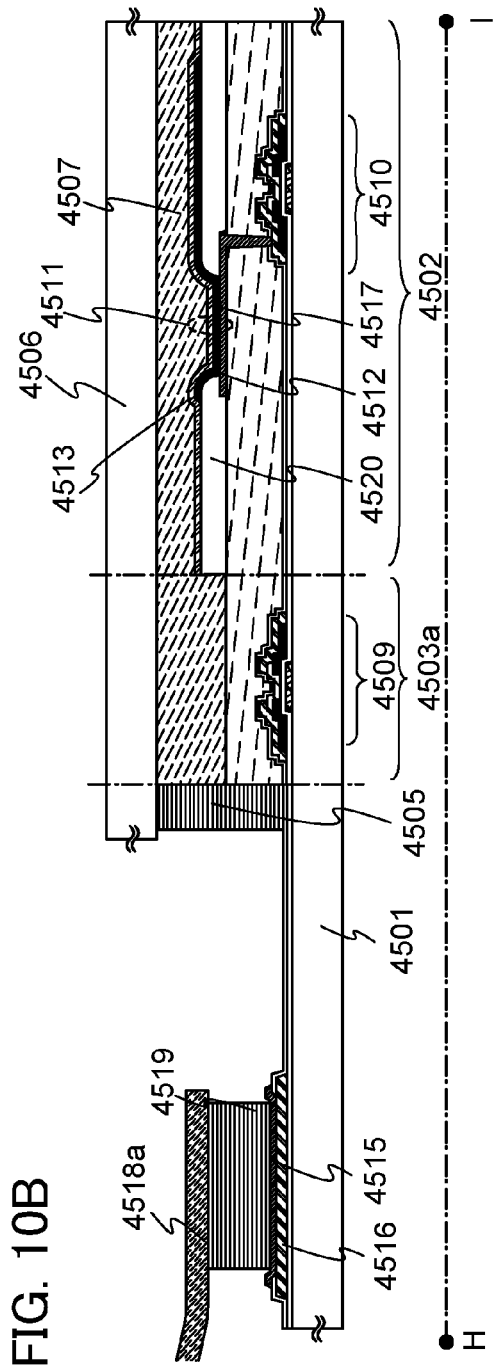

Next, the appearance and cross section of a light-emitting display panel (also referred to as a light-emitting panel) which corresponds to one mode of a semiconductor device according to the present invention will be described using FIGS. 10A and 10B. FIGS. 10A and 10B are a plan view and a cross-sectional view of a panel in which high-performance thin film transistors 4509 and 4510 and a light-emitting element 4511 formed over a first substrate 4501 are sealed using a second substrate 4506 and a sealant 4505. Here, FIG. 10A is the plan view and FIG. 10B is the cross-sectional view along H-I in FIG. 10A.

The sealant 4505 is provided so as to surround a pixel portion 4502, signal line driver circuits 4503a and 4503b, and scan line driver circuits 4504a and 4504b which are provided over the first substrate 4501. In addition, the second substrate 4506 is provided over the pixel portion 4502, the signal line driver circuits 4503a and 4503b, and the scan line driver circuits 4504a and 4504b. That is, the pixel portion 4502, the signal line driver circuits 4503a and 4503b, and the scan line driver circuits 4504a and 4504b are sealed together with a filler 4507, with the first substrate 4501, the sealant 4505, and the second substrate 4506. In this manner, it is preferable that they are packaged (sealed) with a protective film such as an attachment film or an ultraviolet curable resin film or a cover material with high air-tightness and little degasification.

The pixel portion 4502, the signal line driver circuits 4503a and 4503b, and the scan line driver circuits 4504a and 4504b provided over the first substrate 4501 each include a plurality of thin film transistors; the thin film transistor 4510 included in the pixel portion 4502 and the thin film transistor 4509 included in the signal line driver circuit 4503a are illustrated in FIG. 10B.

As each of the thin film transistors 4509 and 4510, the thin film transistor described in any of Embodiments 1 to 3 can be used. In this embodiment, the thin film transistors 4509 and 4510 are n-channel thin film transistors.

Reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that a structure of the light-emitting element 4511 is a stacked-layer structure of the first electrode layer 4517, an electroluminescent layer 4512, and a second electrode layer 4513 in this embodiment, but is not limited to the structure described in this embodiment. The structure of the light-emitting element 4511 can be changed as appropriate depending on the direction in which light is extracted from the light-emitting element 4511 or the like.

A bank 4520 is formed using an organic resin film, an inorganic insulating film, organic polysiloxane, or the like. It is particularly preferable that the bank 4520 be formed using a photosensitive material to have an opening over the first electrode layer 4517 so that a sidewall of the opening forms an inclined surface with continuous curvature.

The electroluminescent layer 4512 may be formed of a single-layer structure or a stacked-layer structure including a plurality of layers.

In order to prevent entry of oxygen, hydrogen, moisture, carbon dioxide, or the like into the light-emitting element 4511, a protective film may be formed over the second electrode layer 4513 and the bank 4520. As the protective film, a silicon nitride film, a silicon nitride oxide film, a DLC film, or the like can be formed.

A variety of signals are supplied to the signal line driver circuits 4503a and 4503b, the scan line driver circuits 4504a and 4504b, the pixel portion 4502, and the like from FPCs 4518a and 4518b.

In the example described in this embodiment, a connection terminal electrode 4515 is formed using the same conductive film as the first electrode layer 4517 included in the light-emitting element 4511, and a terminal electrode 4516 is formed using the same conductive film as a source and drain electrode layers included in the thin film transistor 4509 and a source and drain electrode layers included in the thin film transistor 4510.

The connection terminal electrode 4515 is electrically connected to a terminal of the FPC 4518a through an anisotropic conductive film 4519.

The substrate located in the direction in which light is extracted from the light-emitting element 4511 needs to have a light-transmitting property. As examples of the light-transmitting substrate, there are a glass plate, a plastic plate, a polyester film, an acrylic film, and the like.

As the filler 4507, an ultraviolet curable resin, a thermosetting resin, or the like can be used as well as an inert gas such as nitrogen or argon. For example, polyvinyl chloride (PVC), acrylic, polyimide, epoxy resin, silicone resin, polyvinyl butyral (PVB), ethylene vinyl acetate (EVA), or the like can be used. Described in this embodiment is the example in which nitrogen is used as the filler.

If needed, an optical film such as a polarizing plate, a circular polarizing plate (including an elliptical polarizing plate), a retardation plate (a quarter-wave plate or a half-wave plate), or a color filter may be provided on an emission surface of the light-emitting element. Antireflection treatment may be performed on the surface. For example, anti-glare treatment may be carried out by which reflected light can be diffused by roughness on the surface so as to reduce the glare.

Any of the signal line driver circuits 4503a and 4503b and the scan line driver circuits 4504a and 4504b may be formed using a single crystal semiconductor film or a polycrystalline semiconductor film over a substrate separately prepared. Only the signal line driver circuit or only part thereof, or only the scan line driver circuit or only part thereof may be separately formed to be mounted. This embodiment is not limited to the structure shown in FIGS. 10A and 10B.

Through the above process, a high-performance light-emitting display device (display panel) can be manufactured. This embodiment can be implemented in combination with any of the other embodiments and example as appropriate.

[Embodiment 7]

A semiconductor device of the present invention can be applied to electronic paper. Electronic paper can be used for electronic devices of a variety of fields as long as they display data. For example, electronic paper can be used for electronic book (an e-book reader), posters, advertisement in vehicles such as trains, display in a variety of cards such as credit cards, and so on. Examples of the electronic devices are illustrated in FIGS. 11A and 11B and FIG. 12.

Figure 11A:
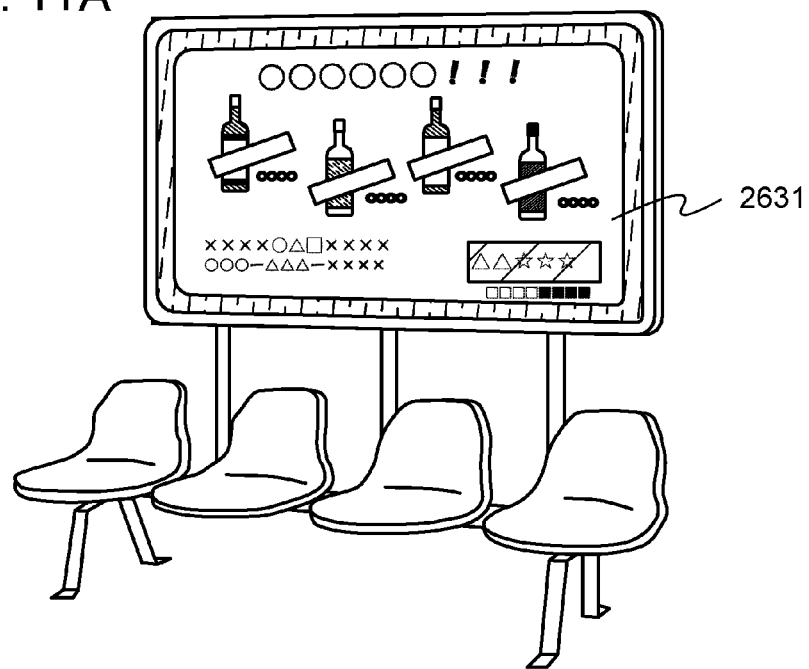
FIGS. 11A and 11B are views illustrating examples of application of electronic paper.

FIG. 11A illustrates a poster 2631 using electronic paper. In the case where an advertising medium is printed paper, the advertisement is replaced by hands; however, by using electronic paper, the advertising display can be changed in a short period of time. In addition, stable images can be obtained without display defects. Note that the poster may have a structure capable of wirelessly transmitting and receiving data.

Figure 11B:
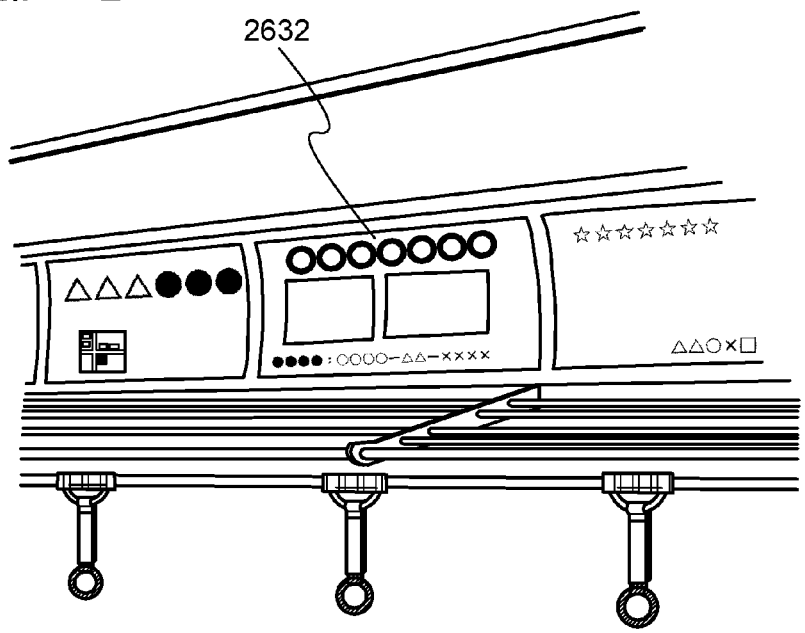

FIG. 11B illustrates an advertisement 2632 in a vehicle such as a train. In the case where an advertising medium is printed paper, the advertisement is replaced by hands; however, by using electronic paper, the advertising display can be changed in a short period of time without hands. In addition, stable images can be obtained without display defects. Note that the advertisement in vehicles may have a structure capable of wirelessly transmitting and receiving data.

Figure 12:
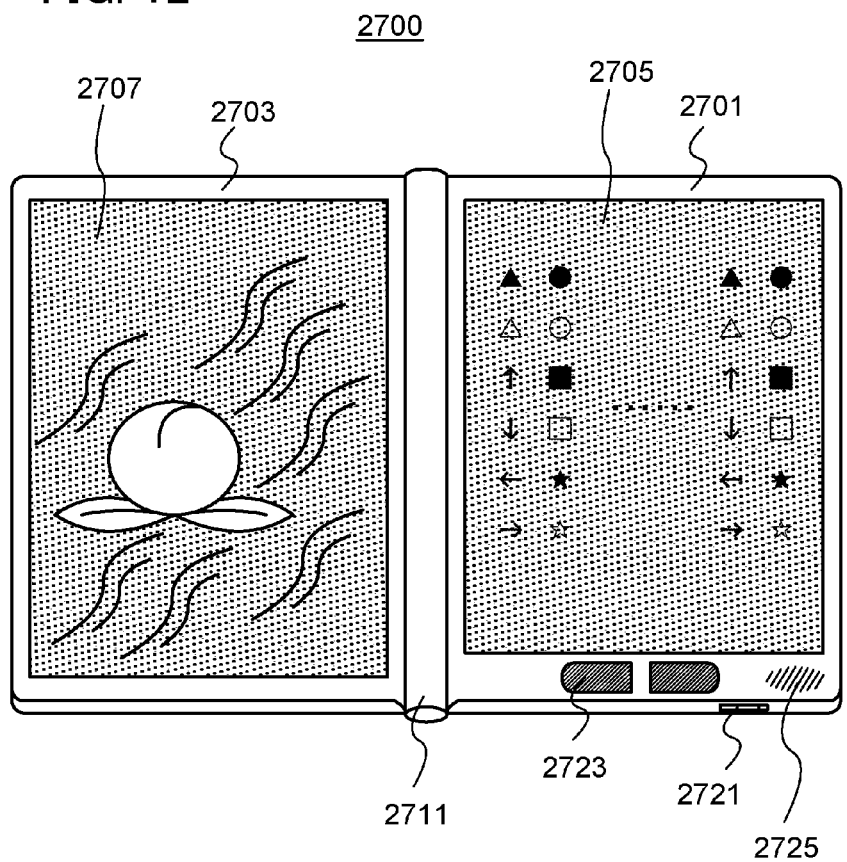
FIG. 12 is an external view illustrating an example of an e-book reader.

FIG. 12 illustrates an example of an e-book reader 2700. For example, the e-book reader 2700 includes two housings: a housing 2701 and a housing 2703. The housing 2701 and the housing 2703 are combined with a hinge 2711 so that the e-book reader 2700 can be opened and closed with the hinge 2711 as an axis. Such a structure enables the e-book reader 2700 to operate like a paper book.

A display portion 2705 and a display portion 2707 are incorporated in the housing 2701 and the housing 2703, respectively. The display portion 2705 and the display portion 2707 may display one image or different images. In the structure where different images are displayed in different display portions, for example, the right display portion (the display portion 2705 in FIG. 12) can display text and the left display portion (the display portion 2707 in FIG. 12) can display an image.

In the example shown in FIG. 12, the housing 2701 is provided with an operation portion and the like. For example, the housing 2701 is provided with a power source 2721, an operation key 2723, a speaker 2725, and the like. With the operation key 2723, pages can be turned. Note that a keyboard, a pointing device, and the like may be provided on the same surface as the display portion of the housing. Further, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the e-book reader 2700 may have a function of an electronic dictionary.

The e-book reader 2700 may have a structure capable of wirelessly transmitting and receiving data. Such a wireless structure enables desired book data or the like to be purchased and downloaded from an electronic book server.

[Embodiment 8]

A semiconductor device of the present invention can be applied to a variety of electronic devices (including an amusement machine). As examples of the electronic devices, the following can be given: a television set (also called TV or a television receiver), a monitor for a computer or the like, a camera such as a digital camera or a digital video camera, a digital photo frame, a mobile phone (also called a cellular phone or a portable telephone device), a portable game machine, a portable information terminal, an audio reproducing device, and a large game machine such as a pachinko machine.

Figure 13A:
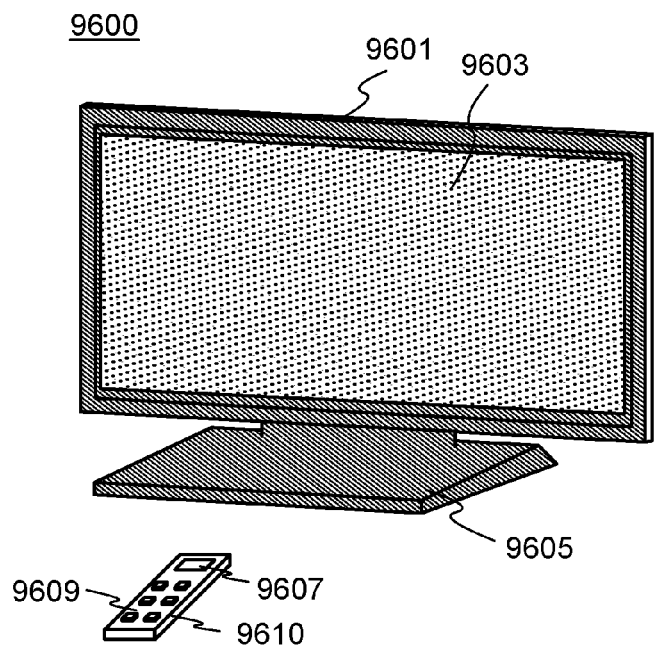
FIGS. 13A and 13B are respective external views illustrating examples of a television set and a digital photo frame.

FIG. 13A illustrates an example of a television set 9600. In the television set 9600, a display portion 9603 is incorporated in a housing 9601. Images can be displayed on the display portion 9603. In FIG. 13A, the housing 9601 is supported by a stand 9605.

The television set 9600 can be operated with an operation switch of the housing 9601 or a separate remote controller 9610. Channels and volume can be controlled by an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. The receiver enables a general television broadcast to be received. Furthermore, when the television set 9600 is connected to a communication network by a wiring or wirelessly via the modem, one-way (from transmitter to receiver) or two-way (between transmitter and receiver, between receivers, or the like) data communication can be performed.

Figure 13B:
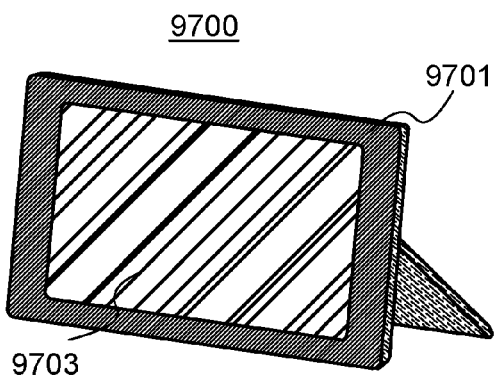

FIG. 13B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot by a digital camera or the like to function like a photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the same surface as the display portion, it is preferable to provide them on the side surface or the back surface in point of the design of the digital photo frame 9700. For example, a memory storing data of an image shot by a digital camera is inserted in the recording medium insertion portion of the digital photo frame, whereby the image data can be imported and displayed on the display portion 9703.

The digital photo frame 9700 may have a structure capable of wirelessly transmitting and receiving data. In that case, desired image data can be imported wirelessly and displayed.

Figure 14A:
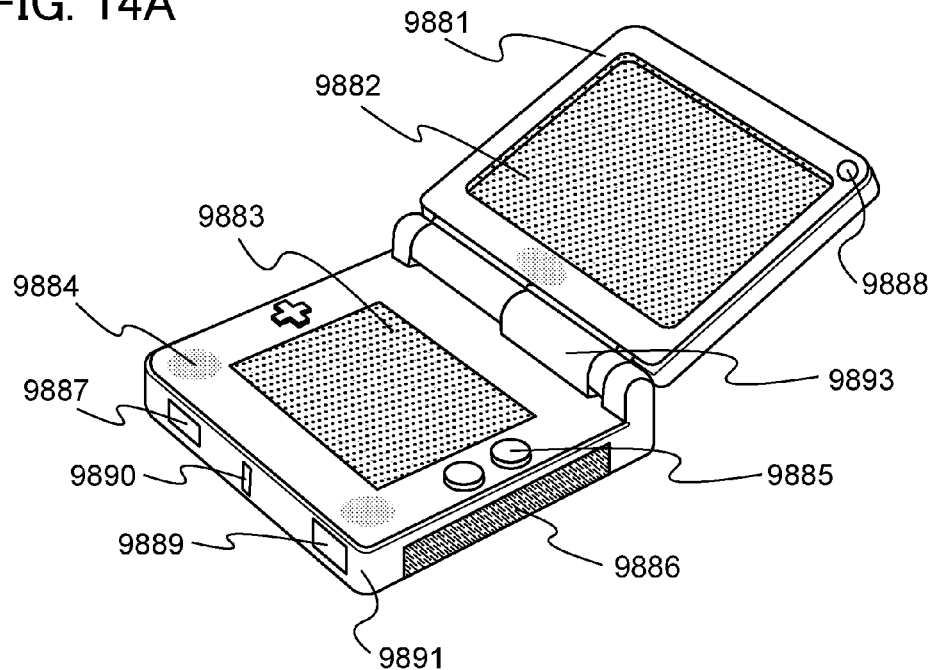
FIGS. 14A and 14B are external views illustrating examples of an amusement machine.

FIG. 14A illustrates a portable amusement machine including housings 9881 and 9891. The housings 9881 and 9891 are connected by a connection portion 9893 so as to open and close. A display portion 9882 and a display portion 9883 are incorporated in the housing 9881 and the housing 9891, respectively. In addition, the portable amusement machine shown in FIG. 14A is provided with a speaker portion 9884, a recording medium insert portion 9886, an LED lamp 9890, input units (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. The structure of the portable amusement machine is not limited to the above-described structure as long as a semiconductor device is provided. The portable amusement machine shown in FIG. 14A has a function of reading out a program or data stored in a storage medium to display on the display portion, and a function of sharing information with another portable amusement machine by wireless communication. The function of the portable amusement machine shown in FIG. 14A is not limited to the above, various other functions may be provided.

Figure 14B:
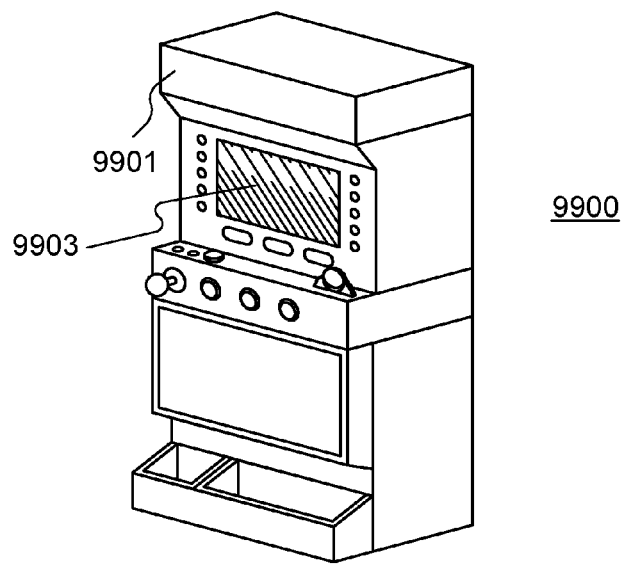

FIG. 14B illustrates an example of a slot machine 9900 which is a large amusement machine. In the slot machine 9900, a display portion 9903 is incorporated in a housing 9901. In addition, the slot machine 9900 includes an operation unit such as a start lever or a stop switch, a coin slot, a speaker, and the like. The structure of the slot machine 9900 is not limited to the above-described structure as long as a semiconductor device is provided.

Figure 15A:
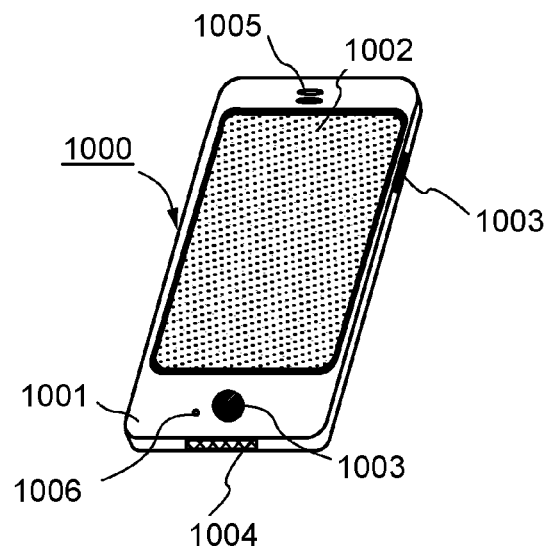
FIGS. 15A and 15B are external views illustrating examples of a mobile phone.

FIG. 15A illustrates an example of a mobile phone 1000. The mobile phone 1000 is provided with a display portion 1002 incorporated in a housing 1001, operation buttons 1003, an external connection port 1004, a speaker 1005, a microphone 1006, and the like.

The display portion 1002 of the mobile phone 1000 illustrated in FIG. 15A is touched with a finger or the like, by which data can be input into the mobile phone 1000. Further, operations such as making calls and composing mails can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode in which two modes of the display mode and the input mode are mixed.

For example, in the case of making a call or composing a mail, a text input mode mainly for inputting text is selected for the display portion 1002 so that text displayed on the screen can be input. In that case, it is preferable to display a keyboard or number buttons on almost all the area of the screen of the display portion 1002.

When a detection device including a sensor for detecting inclination, such as a gyroscope or an acceleration sensor, is provided inside the mobile phone 1000, display on the screen of the display portion 1002 can be automatically switched by judging the direction of the mobile phone 1000 (whether the mobile phone 1000 is placed horizontally or perpendicularly).

The screen modes are switched by touching the display portion 1002, operating the operation buttons 1003 of the housing 1001, or the like. The screen modes can also be switched depending on the kind of an image displayed on the display portion 1002. For example, when a signal for an image displayed on the display portion is data of a moving image, the screen mode is switched to the display mode, whereas when the signal is text data, the screen mode is switched to the input mode.

Further, in the input mode, when input by touching the display portion 1002 is not performed within a specified period while a signal detected by the optical sensor in the display portion 1002 is detected, the screen mode may be controlled so as to be switched from the input mode to the display mode.

The display portion 1002 can also function as an image sensor. For example, an image of a palm print, a fingerprint, or the like is taken when the display portion 1002 is touched with a palm or a finger, whereby personal identification can be performed. Further, by providing a backlight or a sensing light source emitting a near-infrared light for the display portion, an image of a finger vein, a palm vein, or the like can be taken.

Figure 15B:
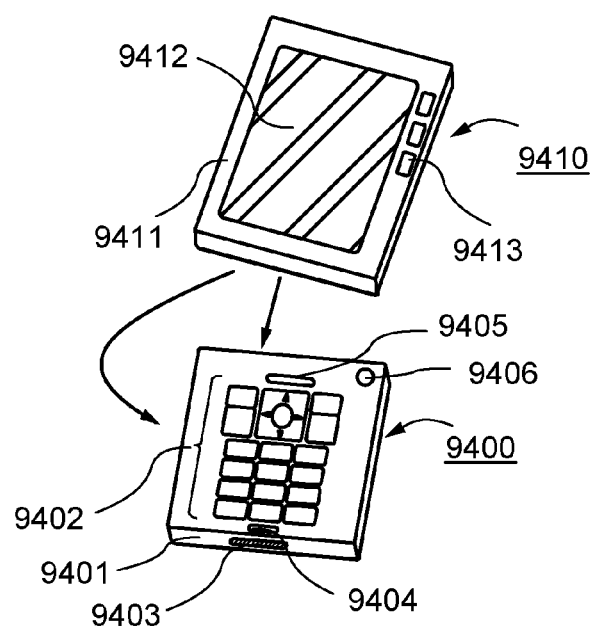

FIG. 15B also illustrates an example of a mobile phone. The mobile phone illustrated in FIG. 15B includes a display device 9410 and a communication device 9400. The display device 9410 includes a housing 9411, a display portion 9412, and operation buttons 9413. The communication device 9400 includes a housing 9401, an operation button 9402, an external input terminal 9403, a microphone 9404, a speaker 9405, and a light-emitting portion 9406 which emits light when incoming. The display device 9410 is capable of connecting to the communication device 9400 having a telephone function in two directions indicated by arrows. Therefore, respective short axes of the display device 9410 and the communication device 9400 may be attached to each other or respective long axes of the display device 9410 and the communication device 9400 may be attached to each other. When only the display function is needed, the display device 9410 can be detached from the communication device 9400 and used alone. The communication device 9400 and the display device 9410 have respective rechargeable batteries and receive and transmit an image or input data by wired or wireless communication.

This embodiment can be implemented in combination with any of the other embodiments and example as appropriate.

EXAMPLE 1

In Example 1, mobility characteristics of transistors were examined in order to confirm the effects of the present invention. Hereinafter, the examination results thereof are described with reference to drawings.

Figure 16A:
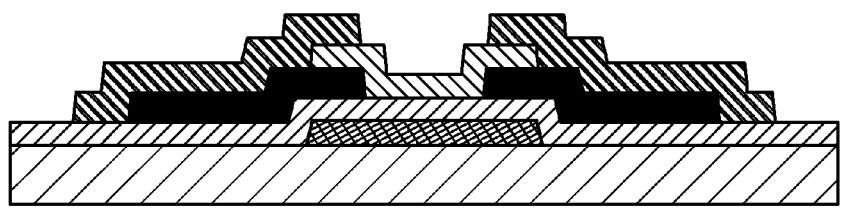
FIGS. 16A and 16B are views illustrating structures of transistors of Example 1.
Figure 16B:
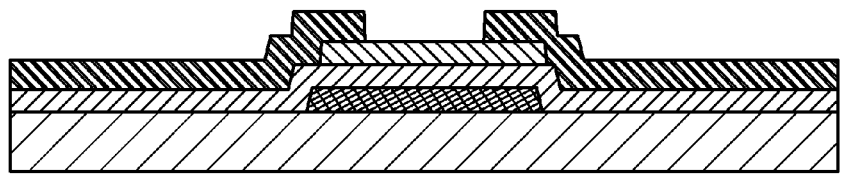

The examination of Example 1 was performed using a transistor having the structure according to Embodiment 1 (see FIG. 16A). Further, for comparison, the same examination to the above was performed using a transistor having a structure in which a lower source electrode layer and a lower drain electrode layer (corresponding to the first source electrode layer and the first drain electrode layer in each embodiment) are not provided (see FIG. 16B).

For the method for manufacturing the transistor, Embodiment 1 was referred to. In Example 1, the difference in the manufacturing process between the transistor shown in FIG. 16A (hereinafter referred to as Transistor A) and the transistor shown in FIG. 16B (hereinafter referred to as Transistor B) is only whether the step of forming a lower source electrode layer and a lower drain electrode layer is included or not.

Figure 17:
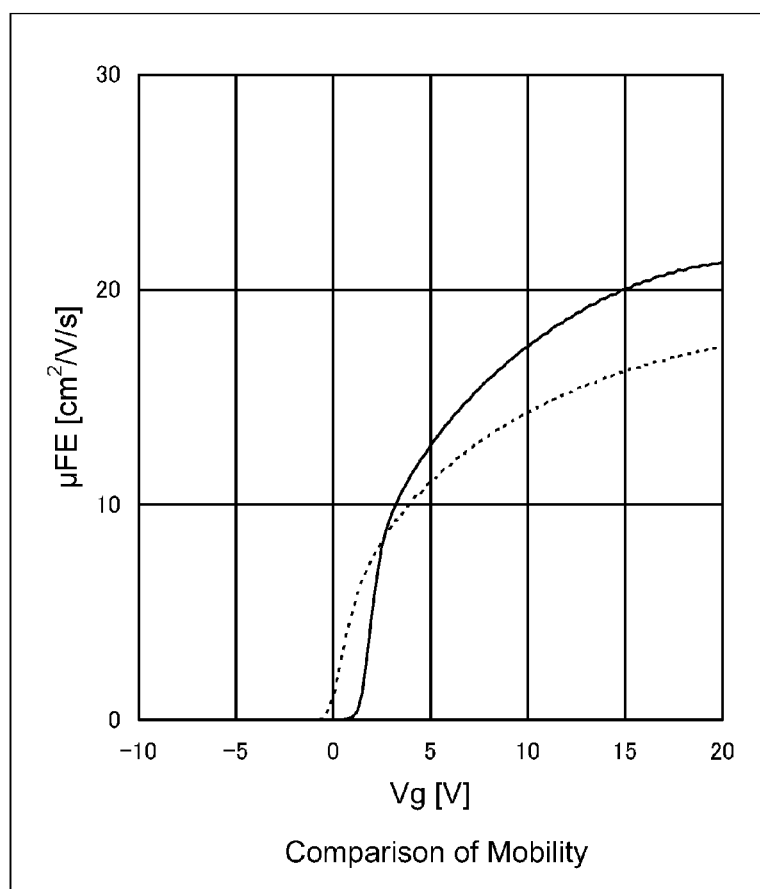
FIG. 17 is a graph showing mobility characteristics of the transistors of Example 1.

Respective mobility characteristics of Transistor A and Transistor B are shown in FIG. 17. The horizontal axis indicates a gate voltage (Vg) and the vertical axis indicates an electric-field effect mobility ($\mu FE$). In Example 1, measurement was performed with a source-drain voltage of 1 V. In FIG. 17, a solid line indicates the characteristics of Transistor A and a dotted line indicates the characteristics of Transistor B. It can be seen from FIG. 17 that the mobility of Transistor A was higher than that of Transistor B by about 5 cm$^2$/Vs (with Vg of 20 V). It can be thought that this is because the contact resistance is largely decreased by the lower source electrode layer and the lower drain electrode layer.

In this manner, improvement of the transistor characteristics according to the present invention was confirmed. This example can be implemented in combination with any of other embodiments as appropriate.

This application is based on Japanese Patent Application serial no. 2008-306219 filed with Japan Patent Office on Dec. 1, 2008, the entire contents of which are hereby incorporated by reference.

REFERENCE NUMERALS

200 . . . substrate, 202 . . . gate electrode layer, 202a . . . source electrode layer, 202b . . . drain electrode layer, 203 . . . insulating layer, 204 . . . gate insulating layer, 205 . . . mask, 206a . . . source electrode layer, 206b . . . drain electrode layer, 208 . . . oxide semiconductor layer, 210 . . . oxide semiconductor layer, 211 . . . conductive film, 212a . . . source electrode layer, 212b . . . drain electrode layer, 220 . . . protective insulating layer, 250 . . . transistor, 400 . . . ion, 585 . . . insulating layer, 600 . . . substrate, 602 . . . substrate, 620 . . . protective insulating layer, 650 . . . thin film transistor, 660 . . . electrode layer, 670 . . . electrode layer, 680 . . . spherical particle, 680a . . . black region, 680b . . . white region, 682 . . . filler, 701 . . . TFT, 702 . . . light-emitting element, 703 . . . cathode, 704 . . . light-emitting layer, 705 . . . anode, 711 . . . TFT, 712 . . . light-emitting element, 713 . . . cathode, 714 . . . light-emitting layer, 715 . . . anode, 716 . . . light-blocking film, 717 . . . conductive film, 721 . . . TFT, 722 . . . light-emitting element, 723 . . . cathode, 724 . . . light-emitting layer, 725 . . . anode, 727 . . . conductive film, 1000 . . . mobile phone, 1001 . . . housing, 1002 . . . display portion, 1003 . . . operation button, 1004 . . . external connection port, 1005 . . . speaker, 1006 . . . microphone, 2600 . . . TFT substrate, 2601 . . . counter substrate, 2602 . . . sealant, 2603 . . . element layer, 2604 . . . liquid crystal layer, 2605 . . . coloring layer, 2606 . . . polarizing plate, 2607 . . . polarizing plate, 2608 . . . wiring circuit portion, 2609 . . . flexible wiring board, 2610 . . . cold-cathode tube, 2611 . . . reflector, 2612 . . . circuit substrate, 2613 . . . diffusion plate, 2631 . . . poster, 2632 . . . advertisement, 2700 . . . e-book reader, 2701 . . . housing, 2703 . . . housing, 2705 . . . display portion, 2707 . . . display portion, 2711 . . . hinge, 2721 . . . power source, 2723 . . . operation key, 2725 . . . speaker, 4001 . . . substrate, 4002 . . . pixel portion, 4003 . . . signal line driver circuit, 4004 . . . scan line driver circuit, 4005 . . . sealant, 4006 . . . substrate, 4008 . . . liquid crystal layer, 4010 . . . thin film transistor, 4011 . . . thin film transistor, 4013 . . . liquid crystal element, 4015 . . . connection terminal electrode, 4016 . . . terminal electrode, 4018 . . . FPC, 4019 . . . anisotropic conductive film, 4020 . . . insulating layer, 4021 . . . insulating layer, 4030 . . . pixel electrode layer, 4031 . . . counter electrode layer, 4032 . . . insulating layer, 4033 . . . insulating layer, 4035 . . . spacer, 4501 . . . substrate, 4502 . . . pixel portion, 4503a . . . signal line driver circuit, 4503b . . . signal line driver circuit, 4504a . . . scan line driver circuit, 4504b . . . scan line driver circuit, 4505 . . . sealant, 4506 . . . substrate, 4507 . . . filler, 4509 . . . thin film transistor, 4510 . . . thin film transistor, 4511 . . . light-emitting element, 4512 . . . electroluminescent layer, 4513 . . . electrode layer, 4515 . . . connection terminal electrode, 4516 . . . terminal electrode, 4517 . . . electrode layer, 4518a . . . FPC, 4518b . . . FPC, 4519 . . . anisotropic conductive film, 4520 . . . bank, 9400 . . . communication device, 9401 . . . housing, 9402 . . . operation button, 9403 . . . external input terminal, 9404 . . . microphone, 9405 . . . speaker, 9406 . . . light-emitting portion, 9410 . . . display device, 9411 . . . housing, 9412 . . . display portion, 9413 . . . operation button, 9600 . . . television set, 9601 . . . housing, 9603 . . . display portion, 9605 . . . stand, 9607 . . . display portion, 9609 . . . operation key, 9610 . . . remote controller, 9700 . . . digital photo frame, 9701 . . . housing, 9703 . . . display portion, 9881 . . . housing, 9882 . . . display portion, 9883 . . . display portion, 9884 . . . speaker portion, 9885 . . . operation key, 9886 . . . recording medium insert portion, 9887 . . . connection terminal, 9888 . . . sensor, 9889 . . . microphone, 9890 . . . LED lamp, 9891 . . . housing, 9893 . . . connection portion, 9900 . . . slot machine, 9901 . . . housing, 9903 . . . display portion.

What is claimed is:

1. A semiconductor device comprising:
a gate electrode layer, a first source electrode layer, and a first drain electrode layer each formed using the same material layer over a substrate;
a gate insulating layer over the gate electrode layer;
an oxide semiconductor layer over the gate insulating layer, the first source electrode layer, and the first drain electrode layer; and
a second source electrode layer and a second drain electrode layer over the oxide semiconductor layer, the first source electrode layer, and the first drain electrode layer,
wherein a first part of a bottom surface of the oxide semiconductor layer is in contact with the first source electrode layer, a second part of the bottom surface is in contact with the first drain electrode layer, and a third part of the bottom surface is in contact with the gate insulating layer,
wherein a first part of a top surface of the oxide semiconductor layer is in contact with the second source electrode layer, and a second part of the top surface is in contact with the second drain electrode layer, and
wherein the first source electrode layer is electrically connected to the second source electrode layer, and the first drain electrode layer is electrically connected to the second drain electrode layer.

2. The semiconductor device according to claim 1,
wherein the oxide semiconductor layer contains at least a material selected from materials consisting of indium, gallium, and zinc.

3. The semiconductor device according to claim 1,
wherein the third part of the bottom surface of the oxide semiconductor layer has higher hydrogen concentration than a channel formation region of the oxide semiconductor layer.

4. The semiconductor device according to claim 1,
wherein the first part of the top surface of the oxide semiconductor layer and the second part of the top surface of the oxide semiconductor layer have higher hydrogen concentration than a channel formation region of the oxide semiconductor layer.

5. The semiconductor device according to claim 1,
wherein the third part of the bottom surface of the oxide semiconductor layer is overlapped with the gate electrode.

6. A method for manufacturing a semiconductor device comprising:
forming a conductive film over a substrate;
forming a gate electrode layer, a first source electrode layer, and a first drain electrode layer using the conductive film;
forming a gate insulating layer over the gate electrode layer;
forming an oxide semiconductor layer over the gate insulating layer, the first source electrode layer and the first drain electrode layer so that a first part of a bottom surface of the oxide semiconductor layer is in contact with the first source electrode layer, a second part of the bottom surface is in contact with the first drain electrode layer, and a third part of the bottom surface is in contact with the gate insulating layer; and
forming a second source electrode layer and a second drain electrode layer over the oxide semiconductor layer, the first source electrode layer, and the first drain electrode layer so that a first part of a top surface of the oxide semiconductor layer is in contact with the second source electrode layer, and a second part of the top surface is in contact with the second drain electrode layer,
wherein the first source electrode layer is electrically connected to the second source electrode layer, and the first drain electrode layer is electrically connected to the second drain electrode layer.

7. The method for manufacturing a semiconductor device according to claim 6,
wherein the oxide semiconductor layer contains at least a material selected from materials consisting of indium, gallium, and zinc.

8. The method for manufacturing a semiconductor device according to claim 6,
wherein the first source electrode layer and the first drain electrode layer contain hydrogen.

9. The method for manufacturing a semiconductor device according to claim 6,
wherein the second source electrode layer and the second drain electrode layer contain hydrogen.

10. The method for manufacturing a semiconductor device according to claim 6, further comprising a step of performing thermal treatment after forming the second source electrode layer and the second drain electrode layer to change a hydrogen concentration of the oxide semiconductor layer.

* * * * *